(12) United States Patent
Yeong et al.

(10) Patent No.: US 12,171,102 B2
(45) Date of Patent: Dec. 17, 2024

(54) METHODS OF MANUFACTURING THREE-DIMENSIONAL MEMORY DEVICES WITH CONDUCTIVE SPACERS

(71) Applicant: Taiwan Semiconductor Manufacturing Co., Ltd., Hsinchu (TW)

(72) Inventors: Sai-Hooi Yeong, Zhubei (TW); Chi On Chui, Hsinchu (TW); Sheng-Chen Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 147 days.

(21) Appl. No.: 17/567,269

(22) Filed: Jan. 3, 2022

(65) Prior Publication Data

US 2023/0008998 A1    Jan. 12, 2023

Related U.S. Application Data

(60) Provisional application No. 63/219,908, filed on Jul. 9, 2021.

(51) Int. Cl.
| | | |
|---|---|---|
| *H10B 51/20* | (2023.01) | |
| *G11C 5/06* | (2006.01) | |
| *G11C 11/22* | (2006.01) | |
| *H01L 21/28* | (2006.01) | |
| *H01L 29/66* | (2006.01) | |
| *H10B 43/10* | (2023.01) | |
| *H10B 43/20* | (2023.01) | |
| *H10B 51/10* | (2023.01) | |
| *H10B 53/20* | (2023.01) | |

(52) U.S. Cl.
CPC ............. *H10B 51/20* (2023.02); *G11C 5/063* (2013.01); *G11C 11/223* (2013.01); *H01L 29/40111* (2019.08); *H01L 29/40117* (2019.08); *H01L 29/6656* (2013.01); *H10B 51/10* (2023.02); *H10B 53/20* (2023.02); *H10B 43/10* (2023.02); *H10B 43/20* (2023.02)

(58) Field of Classification Search
CPC ........ H10B 43/10; H10B 43/20; H10B 51/10; H10B 51/20; H01L 29/40111; H01L 29/40117; H01L 29/6656; G11C 5/063; G11C 11/223
See application file for complete search history.

(56) References Cited

U.S. PATENT DOCUMENTS 9,768,180 B1    9/2017  Zhou et al.
2009/0086521 A1*  4/2009  Herner .................. H01L 27/101
                                                   365/96

(Continued)

*Primary Examiner* — Herve-Louis Y Assouman
*Assistant Examiner* — Christopher M Roland
(74) *Attorney, Agent, or Firm* — Slater Matsil, LLP

(57) ABSTRACT

In an embodiment, a device includes: a first word line over a substrate, the first word line including a first conductive material; a first bit line intersecting the first word line; a first memory film between the first bit line and the first word line; and a first conductive spacer between the first memory film and the first word line, the first conductive spacer including a second conductive material, the second conductive material having a different work function than the first conductive material, the first conductive material having a lower resistivity than the second conductive material.

20 Claims, 32 Drawing Sheets

(56) References Cited

U.S. PATENT DOCUMENTS

| | | | |
|---|---|---|---|
| 2009/0321878 A1* | 12/2009 | Koo | H10B 63/845 |
| | | | 257/536 |
| 2010/0207185 A1* | 8/2010 | Lee | H01L 29/40117 |
| | | | 257/314 |
| 2011/0297912 A1 | 12/2011 | Samachisa et al. | |
| 2015/0117108 A1 | 4/2015 | Shim | |
| 2018/0138292 A1 | 5/2018 | Padilla et al. | |
| 2021/0082955 A1* | 3/2021 | Rajashekhar | H10B 51/10 |
| 2021/0375888 A1* | 12/2021 | Lu | H01L 29/7869 |
| 2022/0130862 A1* | 4/2022 | Lue | H10B 51/20 |
| 2023/0065891 A1* | 3/2023 | Ling | H10B 51/10 |

\* cited by examiner

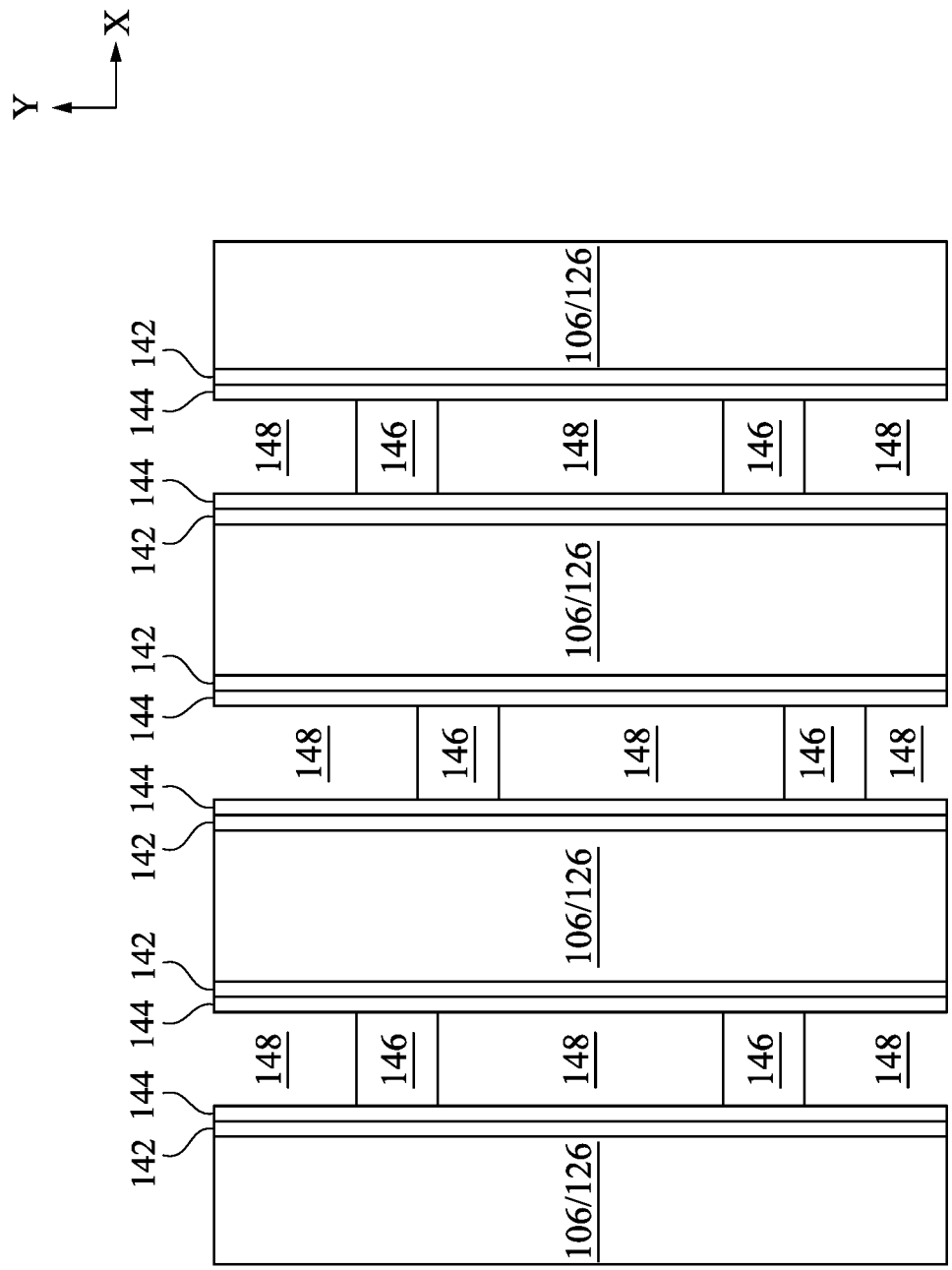

METHODS OF MANUFACTURING THREE-DIMENSIONAL MEMORY DEVICES WITH CONDUCTIVE SPACERS

PRIORITY CLAIM AND CROSS-REFERENCE

This application claims the benefit of U.S. Provisional Application No. 63/219,908, filed on Jul. 9, 2021, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
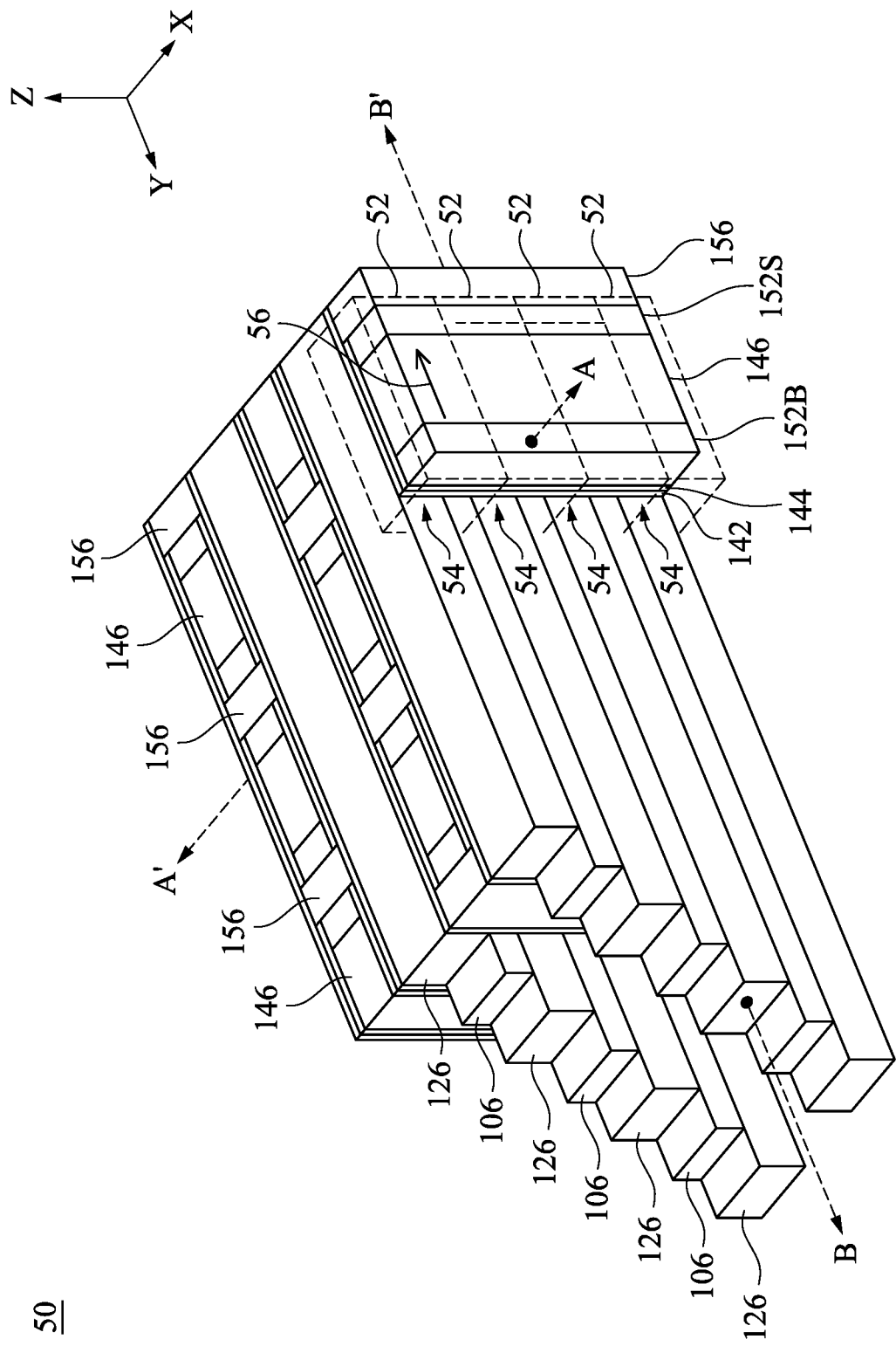
FIGS. 1A-1C illustrate examples of a memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a three-dimensional memory array with a plurality of vertically stacked memory cells. Each memory cell includes a transistor. Each transistor includes an insulating memory film, which provides a gate dielectric for the transistor, and can be polarized to store a digital value. Each transistor further includes a word line and a work function material, which together provide a gate electrode for the transistor. The work function material is between the word line and the insulating memory film of the corresponding transistor. The work functions of the transistors may be tuned by selection of the work function material. Further, the work function material acts as an adhesion layer to improve adhesion between the word line and the insulating memory film. The quantity of interface traps between the gate dielectrics and the gate electrodes of the transistors may thus be reduced. Decreasing the quantity of interface traps allows the insulating memory film to sustain more read/write cycles, thereby increasing the lifespan of the memory array.

Figure 1B:
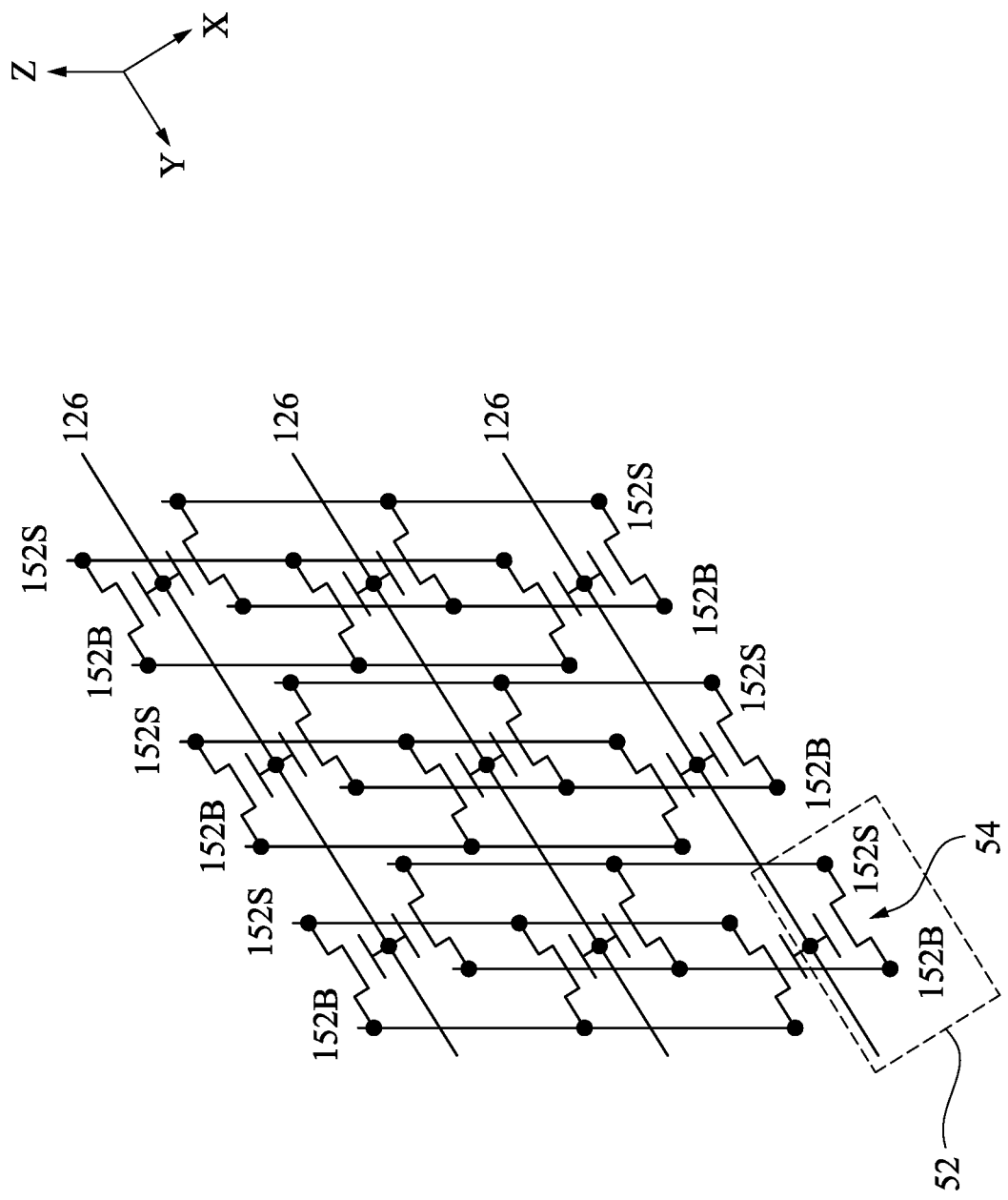
Figure 1C:
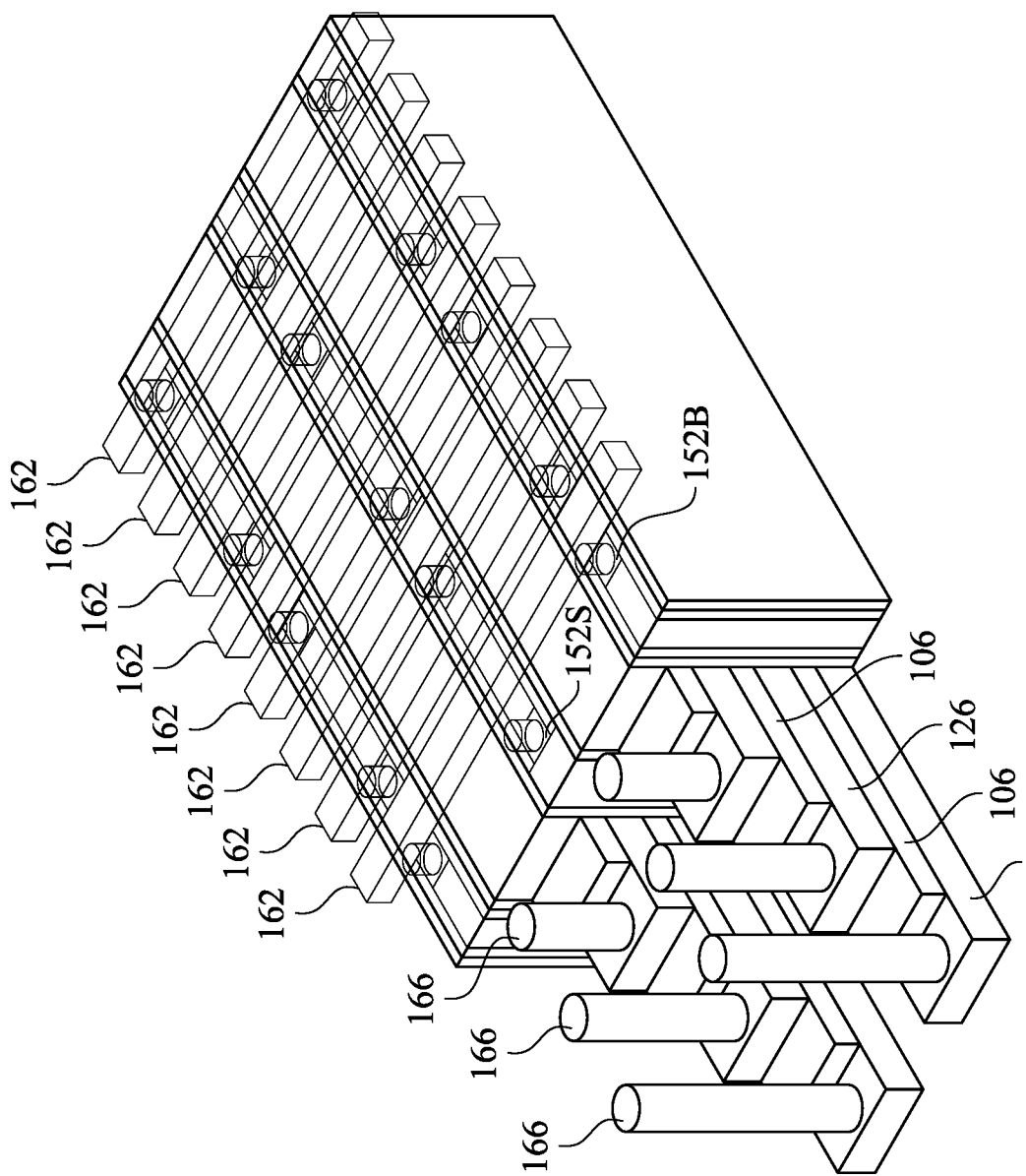

FIGS. 1A-1C illustrate examples of a memory array 50, in accordance with some embodiments. FIG. 1A illustrates an example of a portion of the memory array 50 in a three-dimensional view; FIG. 1B illustrates a circuit diagram of the memory array 50; and FIG. 1C illustrates another example of a portion of the memory array 50 in a three-dimensional view. The memory array 50 includes a plurality of memory cells 52, which are arranged in a grid of rows and columns. The memory cells 52 are further stacked vertically to provide a three dimensional memory array, thereby increasing device density. The memory array 50 may be disposed in an interconnect structure of a semiconductor die, which may be formed in a back end of line (BEOL) process. For example, the memory array 50 may be disposed in interconnect layers of the semiconductor die, such as, above one or more active devices (e.g., transistors) formed on a semiconductor substrate.

In some embodiments, the memory array 50 is a NOR memory array or the like. Each memory cell 52 includes a transistor 54 with an insulating memory film 142 as a gate dielectric. In some embodiments, the transistor 54 is a thin film transistor (TFT). In some embodiments, a gate electrode of each transistor 54 is provided (in part) by a portion of a respective word line 126, a first source/drain electrode of each transistor 54 is provided by a portion of a respective bit line 152B, and a second source/drain electrode of each transistor 54 is provided by a portion of a respective source line 152S. The memory cells 52 in a same horizontal row of the memory array 50 may share a common word line 126 while the memory cells 52 in a same vertical column of the memory array 50 may share a common source line 152S and a common bit line 152B.

The memory array 50 includes a plurality of vertically stacked word line 126 with the word lines 126 disposed between adjacent pairs of dielectric layers 106. The word lines 126 extend in a direction (e.g., the Y-direction) which is parallel to a major surface of an underlying substrate (not separately illustrated in FIGS. 1A-1C). The word lines 126 may have a staircase configuration such that lower word lines 126 are longer than and extend laterally past endpoints of upper word lines 126. For example, in FIG. 1A, multiple, stacked layers of word lines 126 are illustrated with topmost word lines 126 being the shortest and bottommost word lines 126 being the longest. Respective lengths of the word lines 126 may increase in a direction towards the underlying substrate. In this manner, a portion of each of the word lines 126 may be accessible from above the memory array 50, and conductive contacts 166 (see FIG. 1C) may be formed to an exposed portion of each of the word lines 126. In embodiments where the memory array 50 is disposed in the interconnect layers of a semiconductor die, the conductive contacts 166 may be, e.g., vias that connect the exposed portions of the word lines 126 to interconnects 162 (see FIG. 1C) of overlying interconnect layers.

The memory array 50 further includes a plurality of bit lines 152B and a plurality of source lines 152S. The bit lines 152B and the source lines 152S may each extend in a direction (e.g., the Z-direction) which is perpendicular to a lengthwise direction of the word lines 126. An isolation region 146 is disposed between and isolates adjacent ones of the bit lines 152B and the source lines 152S.

Pairs of the bit lines 152B and the source lines 152S along with an intersecting word line 126 define boundaries of each memory cell 52, and an isolation region 156 is disposed between and isolates adjacent pairs of the bit lines 152B and the source lines 152S. In some embodiments, the source lines 152S are electrically coupled to ground. Although FIG. 1A illustrates a particular placement of the bit lines 152B relative the source lines 152S, it should be appreciated that the placement of the bit lines 152B and the source lines 152S may be flipped in other embodiments.

The memory array 50 also includes a semiconductor film 144. The semiconductor film 144 may provide channel regions for the transistors 54 of the memory cells 52. For example, when an appropriate voltage (e.g., higher than a respective threshold voltage (Vth) of a corresponding transistor 54) is applied through a corresponding word line 126, a region of the semiconductor film 144 that intersects the word line 126 may allow current to flow from the bit lines 152B to the source lines 152S (e.g., in the direction indicated by arrow 56).

A memory film 142 is disposed between the word lines 126 and the semiconductor film 144, and the memory film 142 may provide gate dielectrics for the transistors 54. In some embodiments, the memory film 142 is formed of a ferroelectric material, such as a hafnium oxide, hafnium zirconium oxide, silicon-doped hafnium oxide, or the like. Accordingly, the memory array 50 may also be referred to as a ferroelectric random access memory (FeRAM) array. Alternatively, the memory film 142 may be a multilayer structure including a layer of silicon nitride between two layers of silicon oxide (e.g., an oxide-nitride-oxide structure), a different ferroelectric material, a different type of memory layer (e.g., capable of storing a bit), or the like.

In embodiments where the memory film 142 is formed of a ferroelectric material, the memory film 142 may be polarized in one of two different directions, and the polarization direction may be changed by applying an appropriate voltage differential across the memory film 142 and generating an appropriate electric field. The polarization may be relatively localized (e.g., generally contained within each of the boundaries of the memory cells 52), and a continuous region of the memory film 142 may extend across a plurality of memory cells 52. Depending on a polarization direction of a particular region of the memory film 142, a threshold voltage of a corresponding transistor 54 varies, and a digital value (e.g., 0 or 1) can be stored. For example, when a region of the memory film 142 has a first electrical polarization direction, the corresponding transistor 54 may have a relatively low threshold voltage, and when the region of the memory film 142 has a second electrical polarization direction, the corresponding transistor 54 may have a relatively high threshold voltage. The difference between the two threshold voltages may be referred to as the threshold voltage shift. A larger threshold voltage shift makes it easier (e.g., less error prone) to read the digital value stored in the corresponding memory cell 52.

To perform a write operation on a memory cell 52 in such embodiments, a write voltage is applied across a portion of the memory film 142 corresponding to the memory cell 52. The write voltage can be applied, for example, by applying appropriate voltages to a corresponding word line 126, a corresponding bit line 152B, and a corresponding source line 152S. By applying the write voltage across the portion of the memory film 142, a polarization direction of the region of the memory film 142 can be changed. As a result, the corresponding threshold voltage of the corresponding transistor 54 can also be switched from a low threshold voltage to a high threshold voltage or vice versa, and a digital value can be stored in the memory cell 52. Because the word lines 126 intersect the bit lines 152B and the source lines 152S, individual memory cells 52 may be selected for the write operation.

To perform a read operation on the memory cell 52 in such embodiments, a read voltage (a voltage between the low and high threshold voltages) is applied to the corresponding word line 126. Depending on the polarization direction of the corresponding region of the memory film 142, the transistor 54 of the memory cell 52 may or may not be turned on. As a result, the bit line 152B may or may not be discharged through the source line 152S (e.g., to ground), and the digital value stored in the memory cell 52 can be determined. Because the word lines 126 intersect the bit lines 152B and the source lines 152S, individual memory cells 52 may be selected for the read operation.

FIG. 1A further illustrates reference cross-sections of the memory array 50 that are used in later figures. Cross-section A-A' is in the X-direction, and extends through the bit lines 152B/source lines 152S and the isolation regions 146. Cross-section C-C' is in the Y-direction, and extends along a longitudinal axis of a word line 126. Subsequent figures refer to these reference cross-sections for clarity.

FIGS. 2-22C are views of intermediate stages in the manufacturing of a memory array 50, in accordance with some embodiments. Manufacture of the transistors 54 (see FIGS. 1A-1B) for the memory cells 52 (see FIGS. 1A-1B) is illustrated. FIGS. 2, 3, 4, 5, 6, 7, 8, 9, 10, and 11 are three-dimensional views. FIGS. 12, 13, 14, 15, 16, 17, 18A, 19A, 20A, 21A, and 22A are cross-sectional views shown along a similar cross-section as reference cross-sections A-A' in FIG. 1A and FIG. 21B. FIGS. 18B, 19B, 20B, 21B, and 22B are top-down views. FIG. 22C is a cross-sectional view shown along a similar cross-section as reference cross-section C-C' in FIG. 1A. A portion of the memory array 50 is illustrated.

Figure 2:
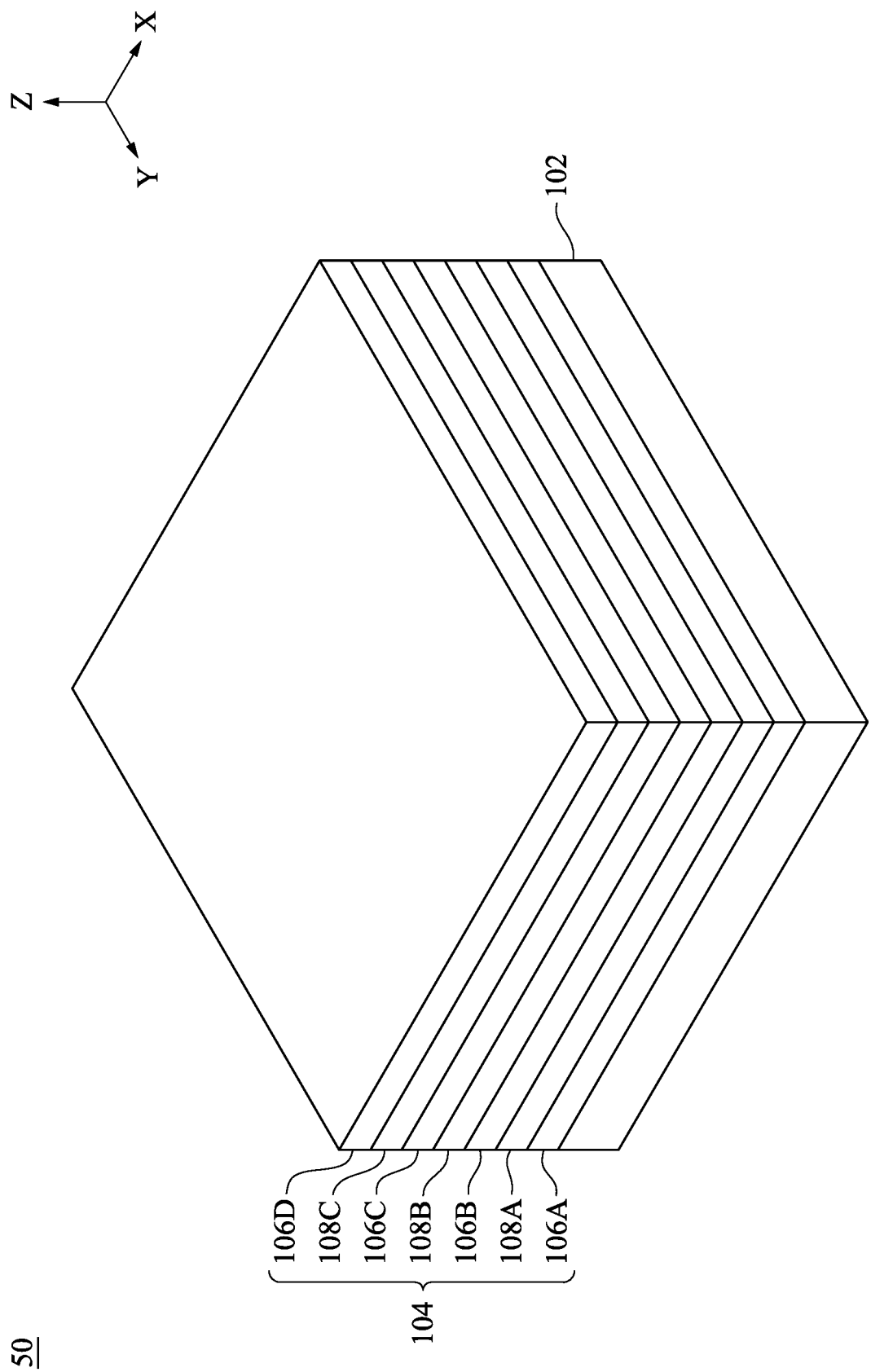
FIGS. 2-22C are views of intermediate stages in the manufacturing of a memory array, in accordance with some embodiments.

In FIG. 2, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be utilized. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Although not shown in FIG. 2, circuits and/or interconnects may be formed over the substrate 102. The circuits include active devices (e.g., transistors) at a top surface of the substrate 102. The transistors may include channel regions, gate structures on the channel regions, and source/drain regions adjoining the channel regions. In some embodiments, the transistors may be planar field effect transistors (FETs), fin field effect transistors (finFETs), nano-field effect transistors (nanoFETs), or the like. An inter-layer dielectric surrounds and isolates the source/drain regions and the gate structures. An interconnect structure, including one or more stacked dielectric layers and interconnects formed in the one or more dielectric layers, is over the inter-layer dielectric. The interconnect structure may include any number of dielectric layers having interconnects disposed therein. The interconnect structure may be electrically connected to the gate structures and the source/drain regions to form functional circuits. In some embodiments, the functional circuits formed by the interconnect structure may include logic circuits, memory circuits, sense amplifiers, controllers, input/output circuits, image sensor circuits, the like, or combinations thereof. Further, other active devices (e.g., diodes or the like) and/or passive devices (e.g., capacitors, resistors, or the like) may also be formed as part of the functional circuits.

A multi-layer stack 104 is formed over the substrate 102 (including the circuits and/or interconnects which may be formed over the substrate 102). The multi-layer stack 104 will be subsequently patterned to form a staircase structure for the memory array 50. Although the multi-layer stack 104 is illustrated as contacting the substrate 102, any number of intermediate layers may be disposed between the substrate 102 and the multi-layer stack 104. For example, one or more interconnect layers comprising interconnects in dielectric layers (e.g., low-k dielectric layers) may be disposed between the substrate 102 and the multi-layer stack 104. In some embodiments, the interconnects may be patterned to provide power, ground, and/or signal lines for the active devices on the substrate 102 and/or the memory array 50 (see FIGS. 1A-1C).

The multilayer stack 104 includes alternating dielectric layers 106 (including dielectric layers 106A, 106B, 106C, 106D) and sacrificial layers 108 (including sacrificial layers 108A, 108B, 108C). The dielectric layers 106 are formed of a first dielectric material, and the sacrificial layers 108 are formed of a second dielectric material. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Each layer of the multilayer stack 104 may be formed by any acceptable deposition process such as chemical vapor deposition (CVD), atomic layer deposition (ALD), or the like. The dielectric layers 106 will be used to isolate subsequently formed transistors. The sacrificial layers 108 may also be referred to as dummy layers, and will be selectively replaced with word lines for the transistors in subsequent processing. As such, the second dielectric material of the sacrificial layers 108 has a high etching selectivity from the etching of the first dielectric material of the dielectric layers 106. In some embodiments, the dielectric layers 106 are formed of silicon oxide, and the sacrificial layers 108 are formed of silicon nitride. Other combinations of dielectric materials having acceptable etching selectivity from one another may also be utilized. In the illustrated embodiment, the multilayer stack 104 includes four of the dielectric layers 106 and three of the sacrificial layers 108. It should be appreciated that the multilayer stack 104 may include other quantities of the dielectric layers 106 and the sacrificial layers 108.

Figure 3:
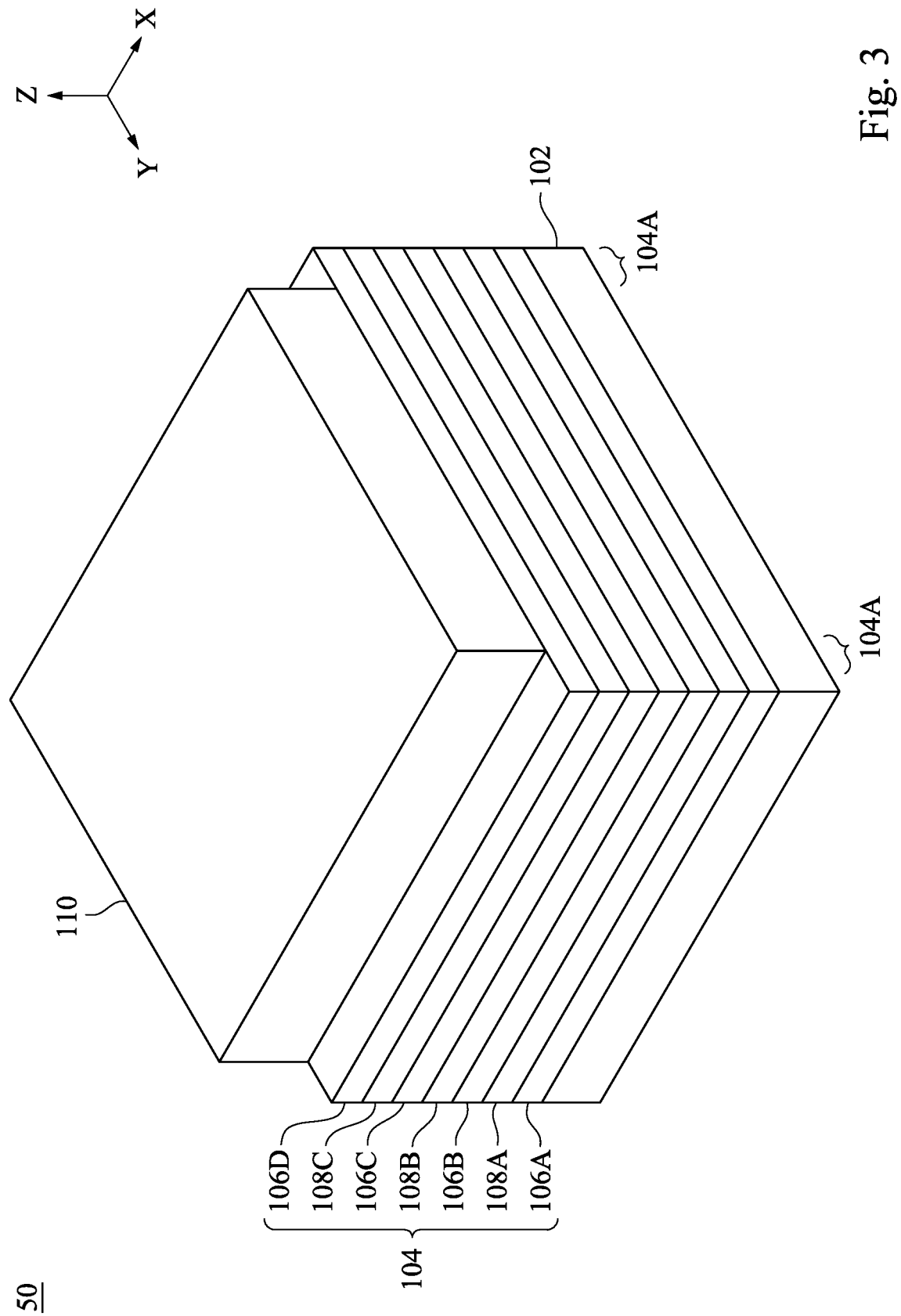

In FIG. 3, a mask 110 is formed over the multi-layer stack 104. The mask 110 may be formed of a photoresist, such as a single layer photoresist, a tri-layer photoresist, or the like. The photoresist may be formed by using a spin-on technique or the like. The mask 110 is then patterned to expose the multi-layer stack 104 in regions 104A while masking remaining portions of the multi-layer stack 104. For example, a topmost layer of the multi-layer stack 104 (e.g., the dielectric layer 106D) may be exposed in the regions 104A. In embodiments where the mask 110 is a photoresist, it may be patterned using acceptable photolithography techniques.

Figure 4:
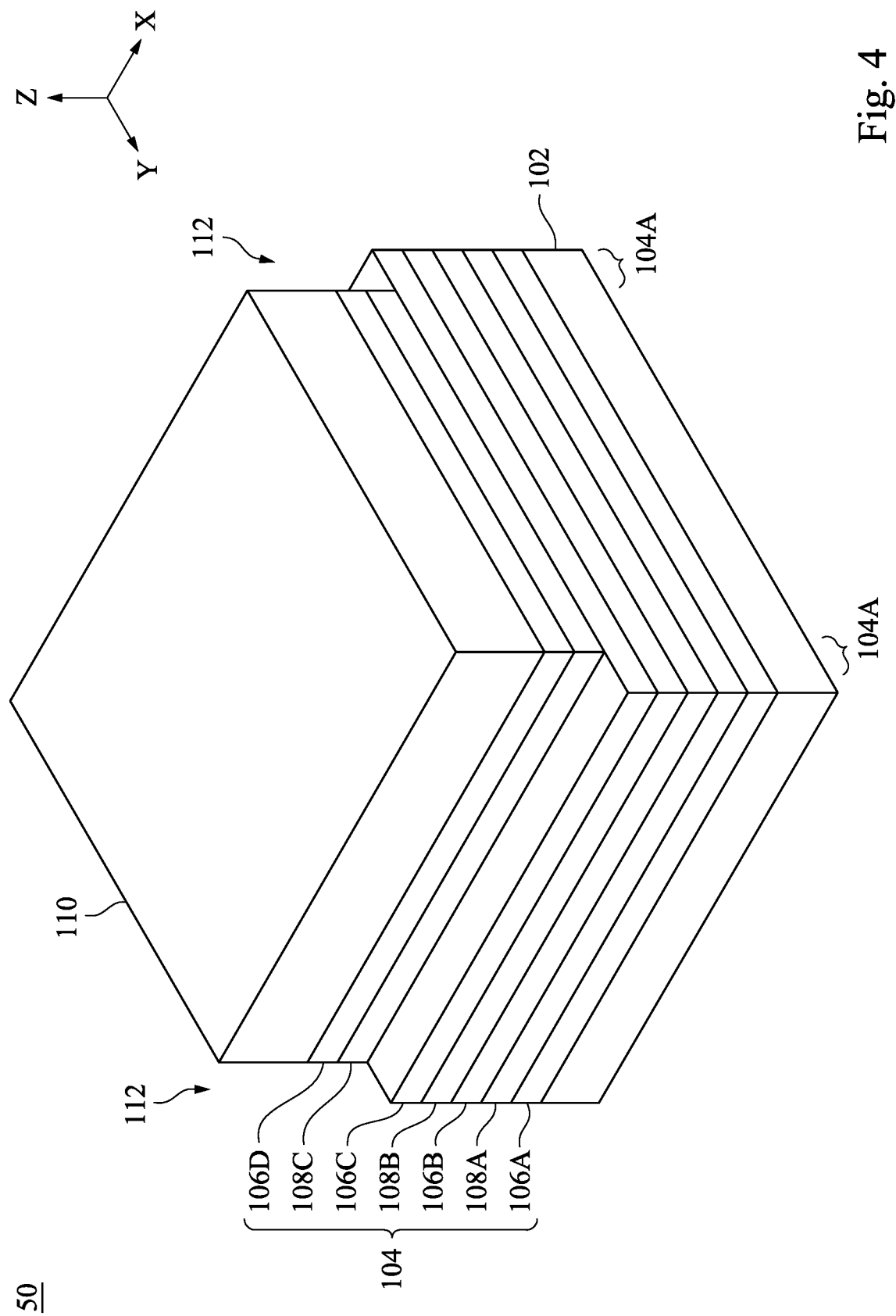

In FIG. 4, the exposed portions of the multi-layer stack 104 in the regions 104A are etched using the mask 110 as an etching mask. The etching may be any acceptable etch process, such as by wet or dry etching, a reactive ion etch (RIE), neutral beam etch (NBE), the like, or a combination thereof. The etching may be anisotropic. The etching may remove portions of the dielectric layer 106D and sacrificial layer 108C in the regions 104A and define openings 112. Because the dielectric layer 106D and the sacrificial layer 108C have different material compositions, etchants used to remove exposed portions of these layers may be different. In some embodiments, the sacrificial layer 108C acts as an etch stop layer while etching the dielectric layer 106D, and the dielectric layer 106C acts as an etch stop layer while etching sacrificial layer 108C. As a result, the portions of the dielectric layer 106D and the sacrificial layer 108C may be selectively removed without removing remaining layers of the multi-layer stack 104, and the openings 112 may be extended to a desired depth. Alternatively, a timed etch processes may be used to stop the etching of the openings 112 after the openings 112 reach a desired depth. In the resulting structure, the dielectric layer 106C is exposed in the regions 104A.

Figure 5:
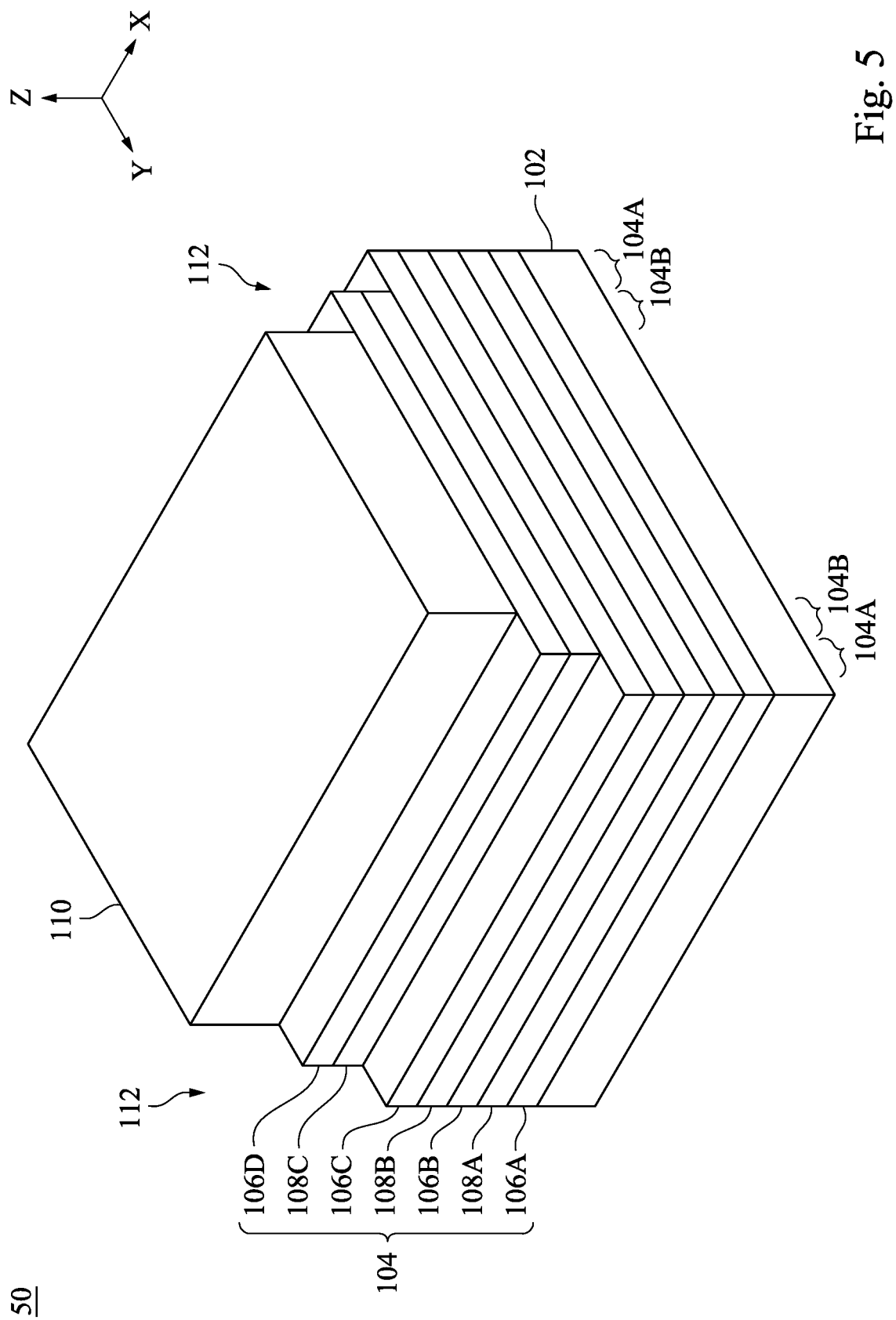

In FIG. 5, the mask 110 is trimmed to expose additional portions of the multi-layer stack 104. In embodiments where the mask 110 is a photoresist, it can be trimmed using acceptable photolithography techniques. As a result of the trimming, a width of the mask 110 is reduced, and portions the multi-layer stack 104 in regions 104A, 104B may be exposed. For example, a top surface of the dielectric layer 106C may be exposed in the regions 104A, and a top surface of the dielectric layer 106D may be exposed in the regions 104B.

Figure 6:
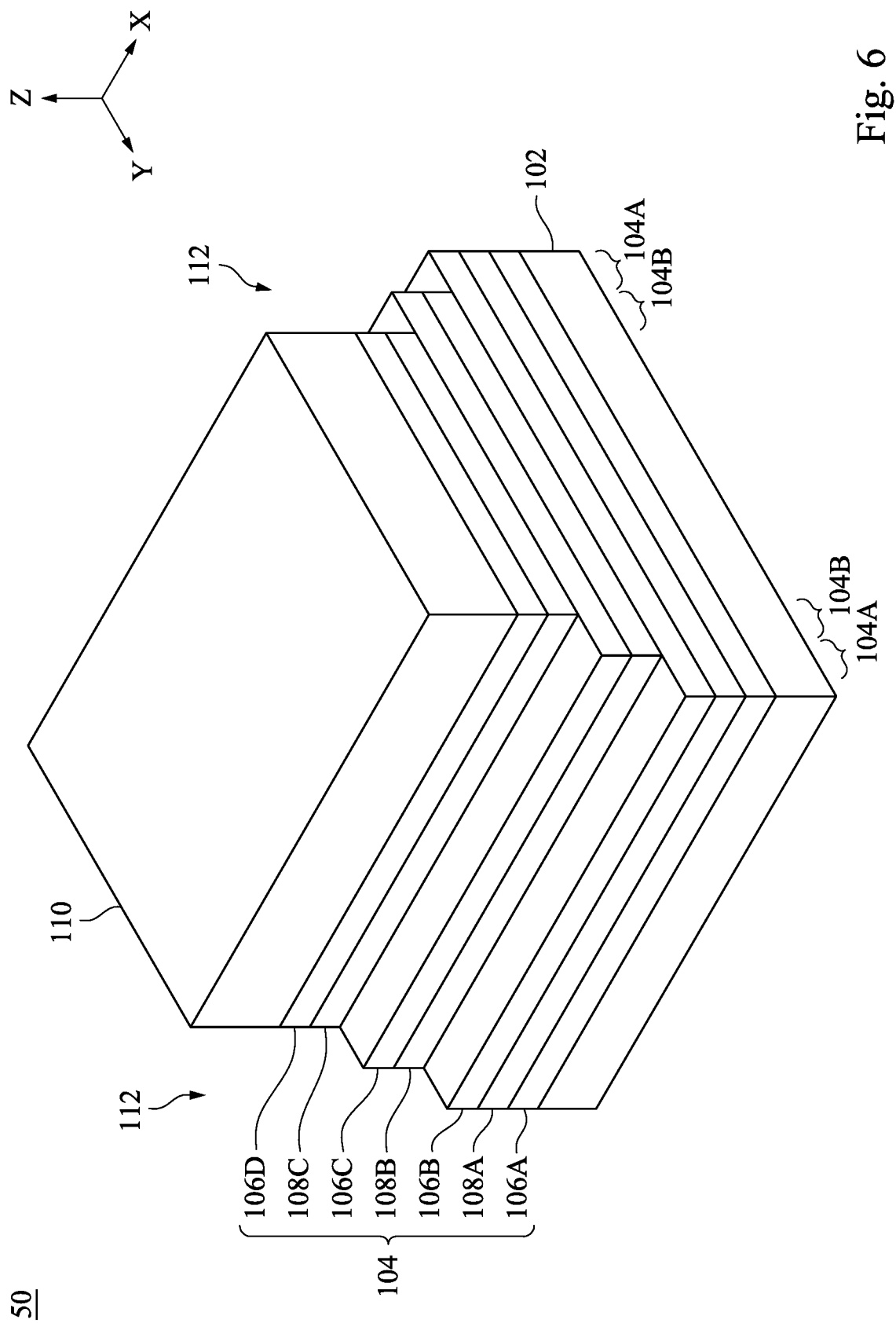

In FIG. 6, portions of the dielectric layer 106D, the sacrificial layer 108C, the dielectric layer 106C, and the sacrificial layer 108B in the regions 104A, 104B are removed by acceptable etching processes using the mask 110 as an etching mask. The etching may be any acceptable etch process, such as by wet or dry etching, a reactive ion etch (RIE), neutral beam etch (NBE), the like, or a combination thereof. The etching may be anisotropic. The etching extends the openings 112 further into the multi-layer stack 104. Because the dielectric layers 106D, 106C and the sacrificial layers 108C, 108B have different material compositions, etchants used to remove exposed portions of these layers may be different. In some embodiments, the sacrificial layer 108C acts as an etch stop layer while etching the dielectric layer 106D; the dielectric layer 106C acts as an etch stop layer while etching sacrificial layer 108C; the sacrificial layer 108B acts as an etch stop layer while etching the dielectric layer 106C; and the dielectric layer 106B acts as an etch stop layer while etching the sacrificial layer 108B. As a result, portions of the dielectric layers 106D, 106C and the sacrificial layer 108C, 108B may be selectively removed without removing remaining layers of the multi-layer stack 104, and the openings 112 may be extended to a desired depth. Further, during the etching processes, unetched portions of the dielectric layers 106 and sacrificial layers 108 act as a mask for underlying layers, and as a result a previous pattern of the dielectric layer 106D and the sacrificial layer 108C (see FIG. 5) is transferred to the underlying dielectric layer 106C and sacrificial layer 108B. In the resulting structure, the dielectric layer 106B is exposed in the regions 104A, and the dielectric layer 106C is exposed in the regions 104B.

Figure 7:
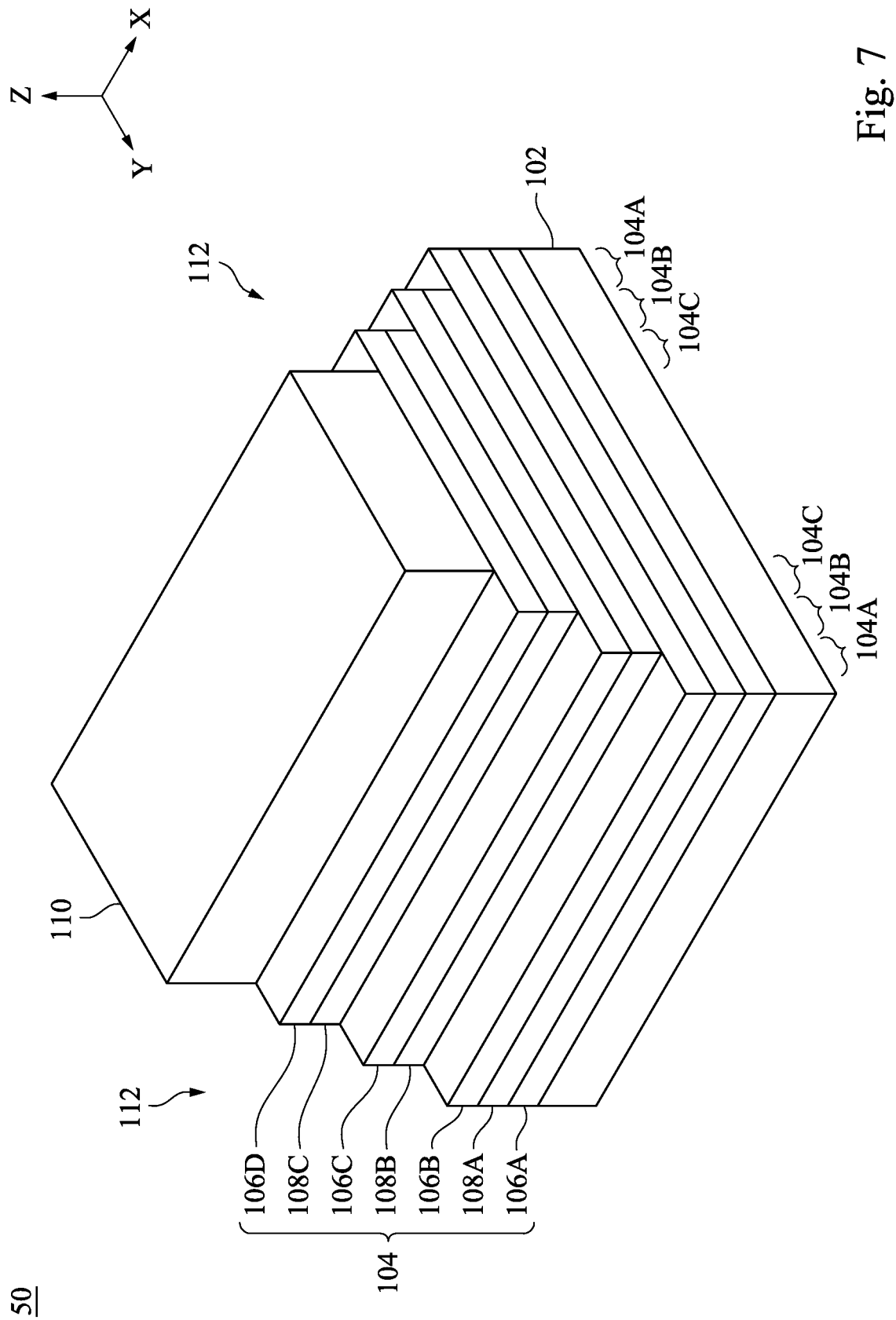

In FIG. 7, the mask 110 is trimmed to expose additional portions of the multi-layer stack 104. In embodiments where the mask 110 is a photoresist, it can be trimmed using acceptable photolithography techniques. As a result of the trimming, a width of the mask 110 is reduced, and portions of the multi-layer stack 104 in regions 104A, 104B, 104C may be exposed. For example, a top surface of the dielectric layer 106B may be exposed in the regions 104A; a top surface of the dielectric layer 106C may be exposed in the regions 104B; and a top surface of the dielectric layer 106D may be exposed in the regions 104C.

Figure 8:
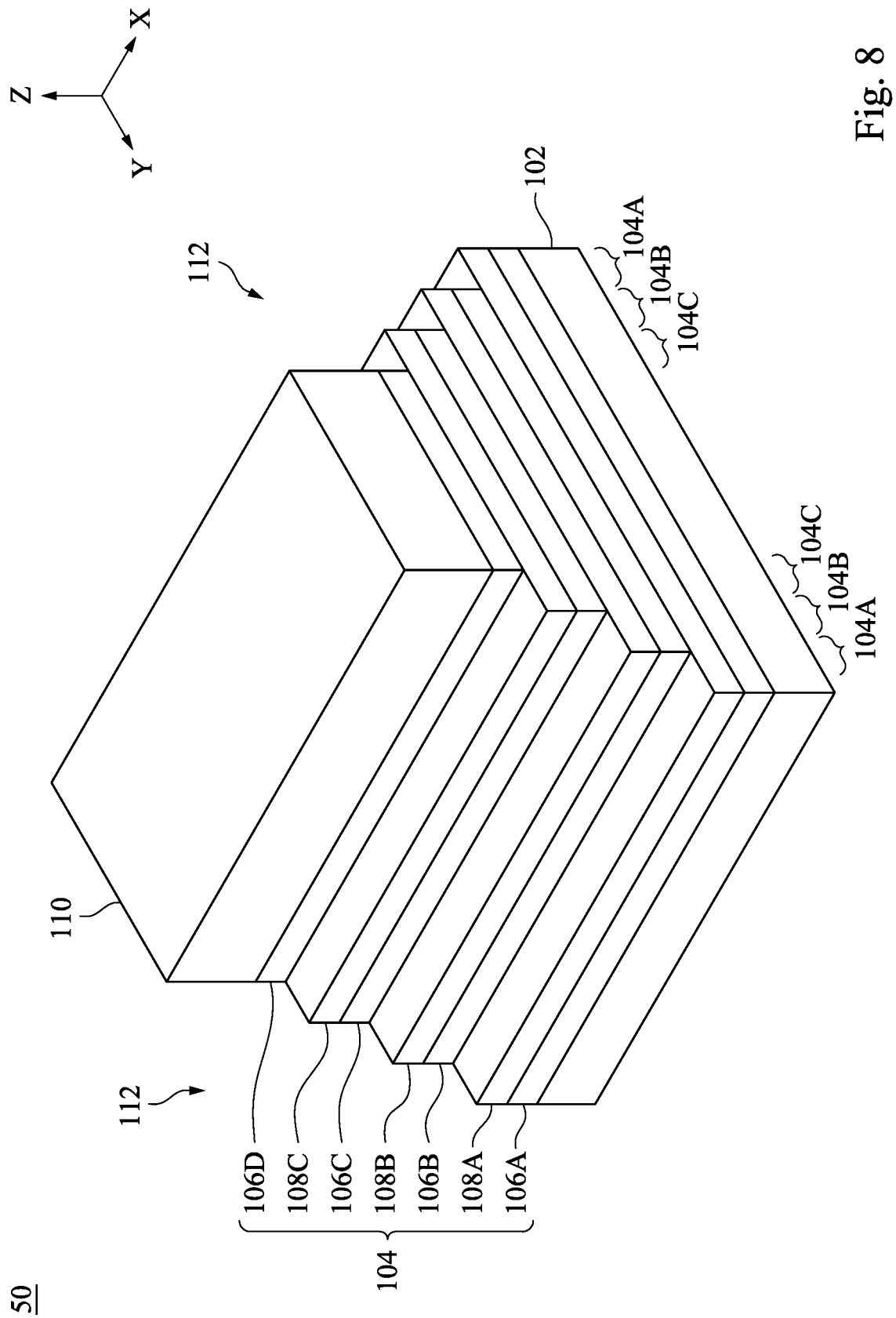

In FIG. 8, portions of the dielectric layers 106D, 106C, 106B in the regions 104A, 104B, 104C are removed by acceptable etching processes using the mask 110 as an etching mask. The etching may be any acceptable etch process, such as by wet or dry etching, a reactive ion etch (RIE), neutral beam etch (NBE), the like, or a combination thereof. The etching may be anisotropic. The etching extends the openings 112 further into the multi-layer stack 104. In some embodiments, the sacrificial layer 108C acts as an etch stop layer while etching the dielectric layer 106D; the sacrificial layer 108B acts as an etch stop layer while etching the dielectric layer 106C; and the sacrificial layer 108A acts as an etch stop layer while etching the dielectric layer 106B. As a result, portions of the dielectric layers 106D, 106C, 106B may be selectively removed without removing remaining layers of the multi-layer stack 104, and the openings 112 may be extended to a desired depth. Further, during the etching processes, each of the sacrificial layers 108 act as a mask for underlying layers, and as a result a previous pattern of the sacrificial layers 108C, 108B (see FIG. 7) is transferred to the underlying dielectric layers 106C, 106B. In the resulting structure, the sacrificial layer 108A is exposed in the regions 104A; the sacrificial layer 108B is exposed in the regions 104B; and the sacrificial layer 108C is exposed in the regions 104C.

Figure 9:
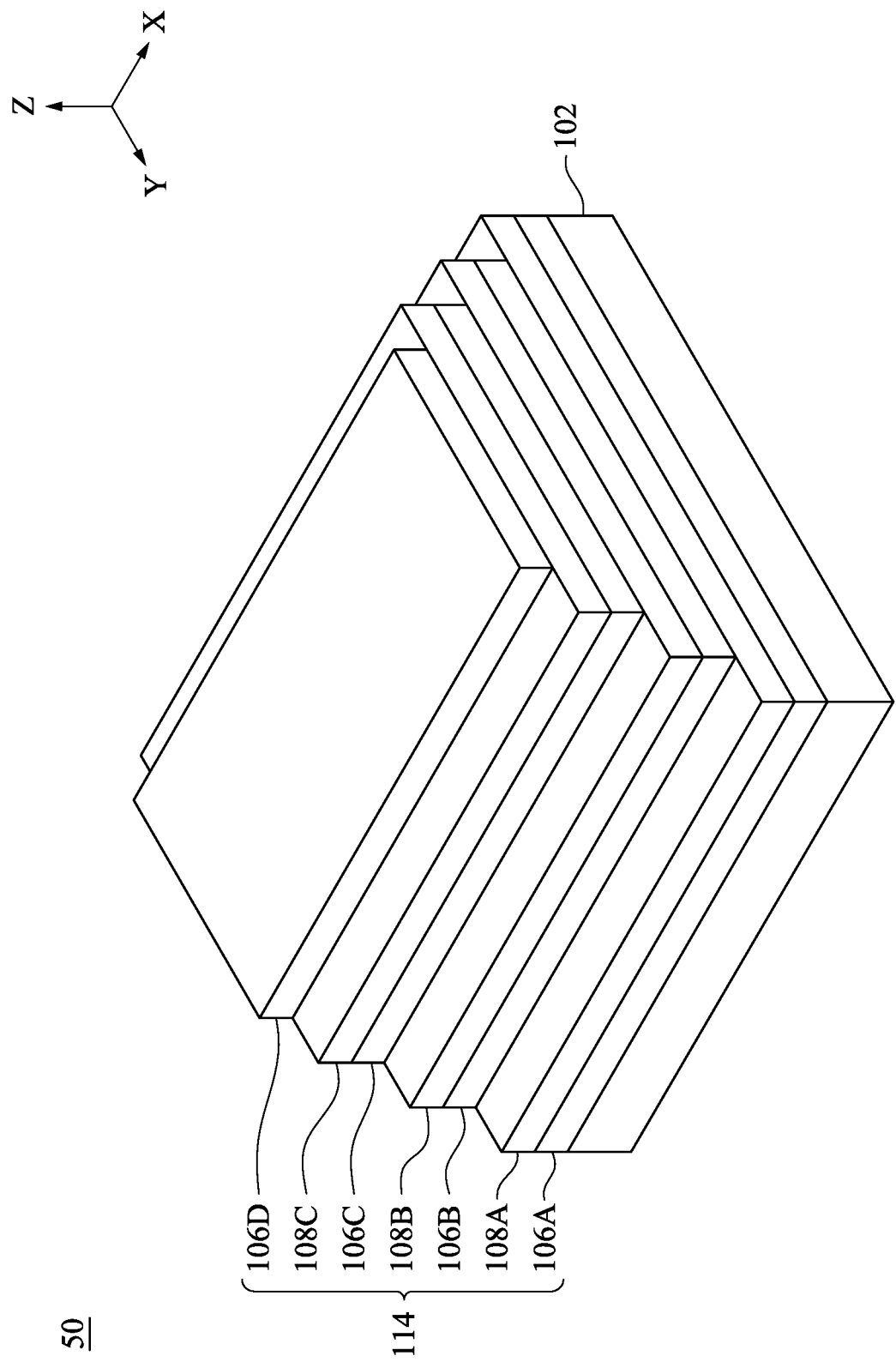

In FIG. 9, the mask 110 may be removed. In embodiments where the mask 110 is a photoresist, it can be removed by any acceptable ashing or wet strip process. Thus, a staircase structure 114 is formed from the remaining portions of the multi-layer stack 104. The staircase structure comprises a stack of alternating ones of the dielectric layers 106 and the sacrificial layers 108. As noted above, the sacrificial layers 108 will be selectively replaced with word lines for the transistors 54 (see FIGS. 1A-1B) in subsequent processing. Lower sacrificial layers 108 are wider and extend laterally past upper sacrificial layers 108, and a width of each of the sacrificial layers 108 increases in a direction towards the substrate 102. For example, the sacrificial layer 108A may be longer than the sacrificial layer 108B, and the sacrificial layer 108B may be longer than the sacrificial layer 108C. As a result, conductive contacts can be made from above the staircase structure 114 to the conductive lines formed in subsequent processing steps.

Figure 10:
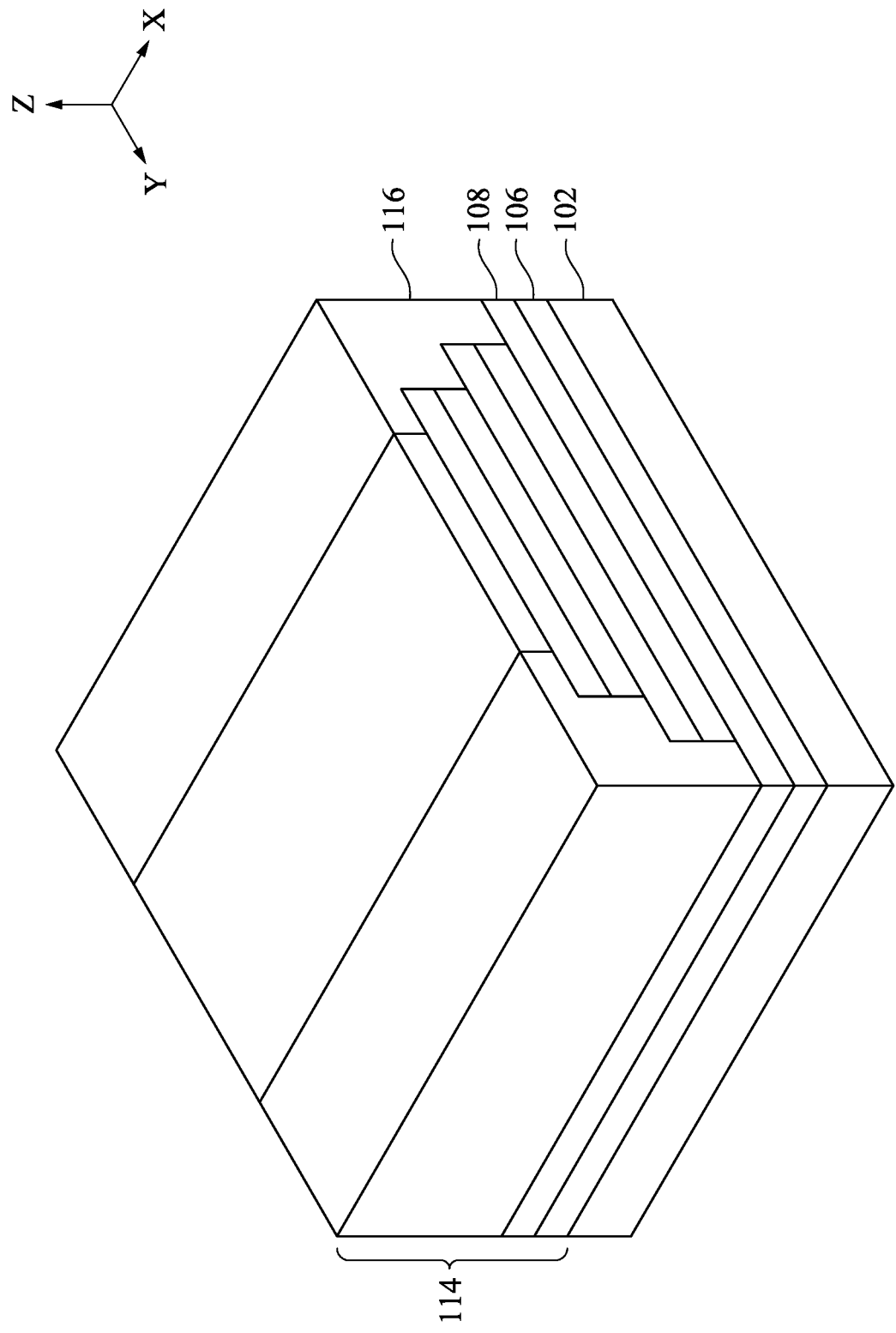

In FIG. 10, an inter-metal dielectric (IMD) 116 is deposited over the staircase structure 114. The IMD 116 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be utilized. The IMD 116 extends along sidewalls of the dielectric layers 106 as well as sidewalls of the sacrificial layers 108. Further, the IMD 116 may contact top surfaces of each of the sacrificial layers 108. After the IMD 116 is formed, a removal process is applied to the IMD 116 to remove excess dielectric material over the staircase structure 114. In some embodiments, a planarization process such as a chemical mechanical polish (CMP) process, an etch-back process, combinations thereof, or the like may be utilized. The planarization process exposes the staircase structure 114 such that top surfaces of the staircase structure 114 and the IMD 116 are level after the planarization process is complete.

Figure 11:
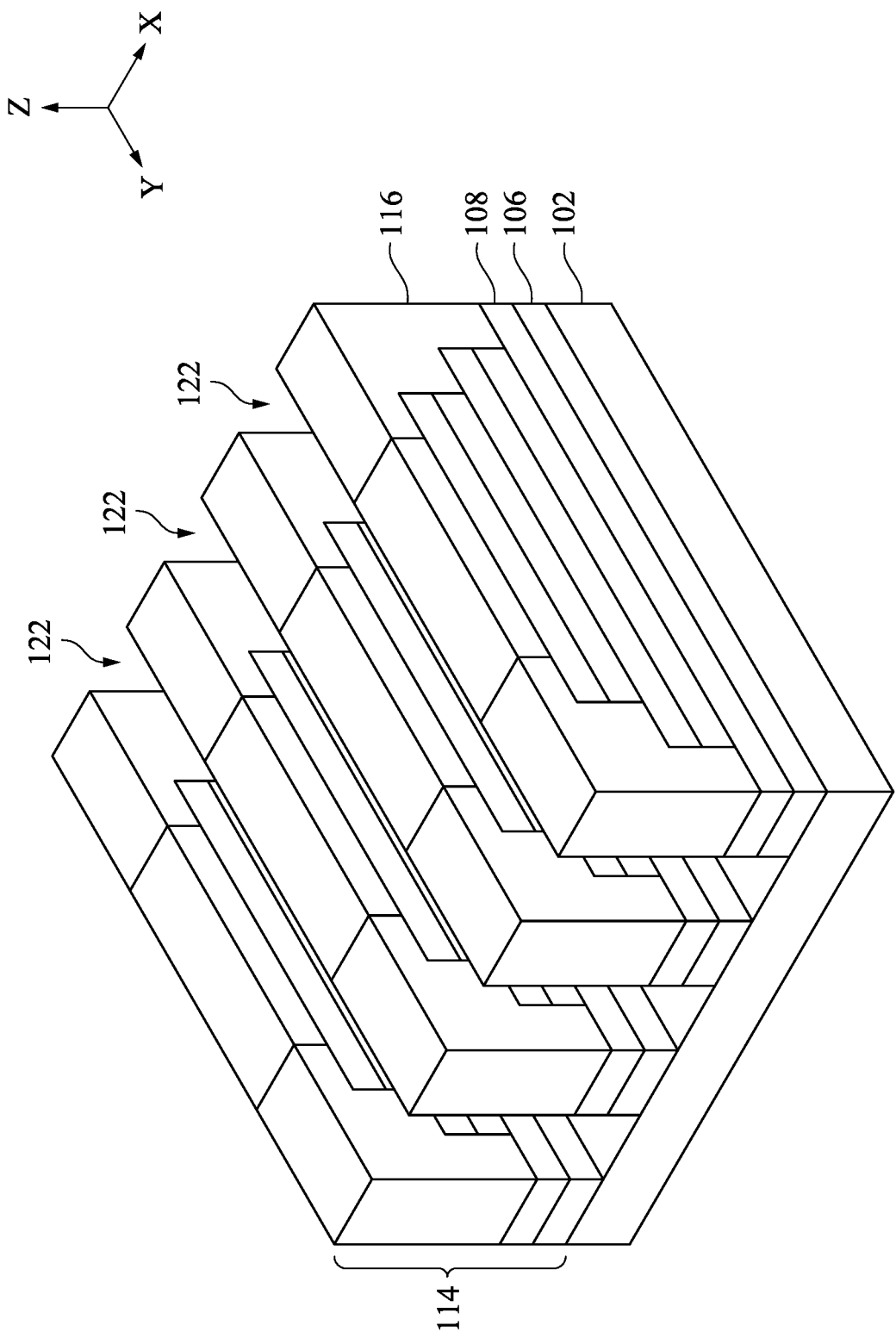

In FIG. 11, trenches 122 are patterned in the staircase structure 114 and the IMD 116. The trenches 122 may be patterned using acceptable photolithography and etching techniques, such as with an etching process that is selective to the staircase structure 114 (e.g., selectively removes the dielectric materials of the dielectric layers 106 and the sacrificial layers 108 at a faster rate than other materials). The etching may be any acceptable etch process, such as a reactive ion etch (RIE), neutral beam etch (NBE), the like, or a combination thereof. The etching may be anisotropic. After the patterning, respective portions of the staircase structure 114 are disposed between respective ones of the trenches 122. As noted above, the sacrificial layers 108 will be selectively replaced with word lines for the transistors 54 (see FIGS. 1A-1B) in subsequent processing. By etching the trenches 122 through the sacrificial layers 108, the subsequently formed conductive lines can be separated from each other.

Figure 12:
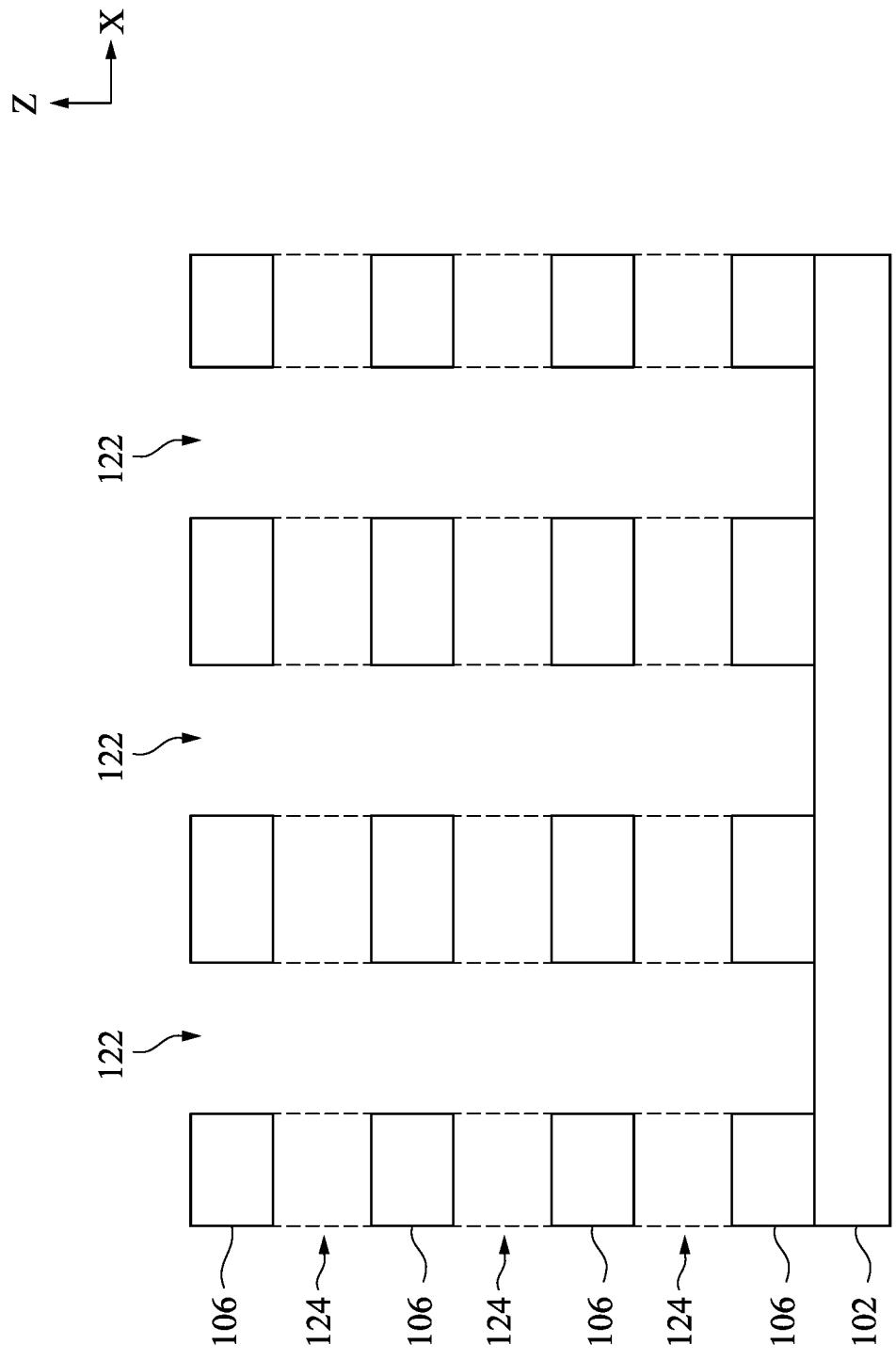

In FIG. 12, the sacrificial layers 108 are removed to form sidewall openings 124. The sidewall openings 124 extend between adjacent trenches 122. The sidewall openings 124 may be formed by any acceptable etching process, such as one that is selective to the material of the sacrificial layers 108 (e.g., selectively removes the material of the sacrificial layers 108 at a faster rate than the material of the dielectric layers 106). The etching may be isotropic. In embodiments where the dielectric layers 106 are formed of silicon oxide, and the sacrificial layers 108 are formed of silicon nitride, the sacrificial layers 108 can be removed by a wet etch using phosphoric acid ($H_3PO_4$). In another embodiment, a dry etch selective to the material of the sacrificial layers 108 may be utilized.

Figure 13:
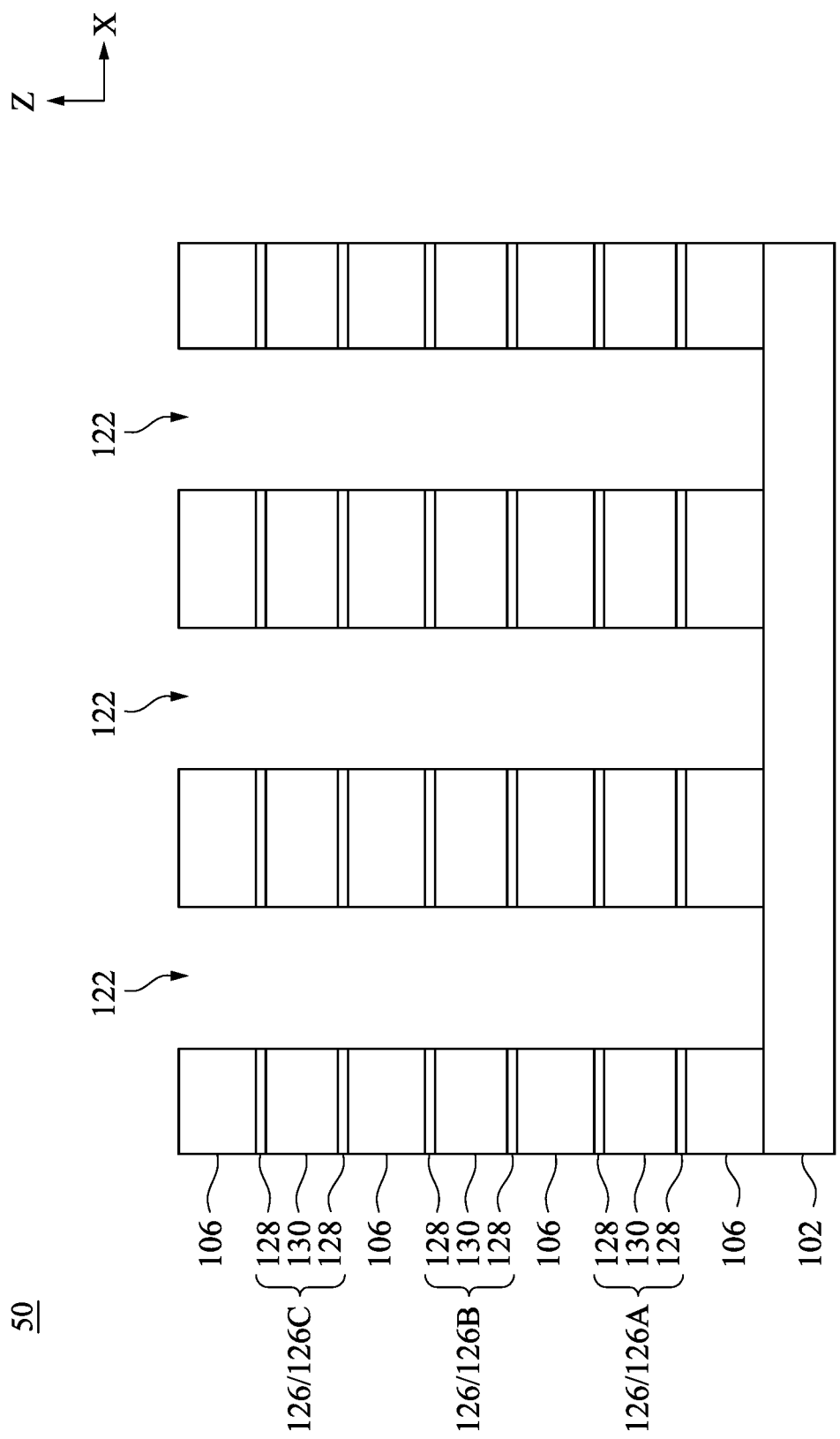

In FIG. 13, word lines 126 (including word lines 126A, 126B, 126C) for the memory array 50 are formed in the sidewall openings 124, thus completing a process for replacing the sacrificial layers 108 with conductive lines. The word lines 126 may each include one or more layers, such as seed layers, glue layers, barrier layers, diffusion layers, fill layers, and the like. In some embodiments, the word lines 126 each include a pair of liner layers 128, such as diffusion barrier layers, adhesion layers, or the like, and a main layer 130 sandwiched between the liner layers 128. Each liner layer 128 extends along a top surface of a bottom surface of a corresponding main layer 130 located within a corresponding sidewall opening 124. The liner layers 128 are formed of a first conductive material that can be utilized to help grow or to help adhere a subsequently deposited material, such as a metal nitride, such as titanium nitride, tantalum nitride, molybdenum nitride, zirconium nitride, hafnium nitride, or the like. The main layers 130 may are formed of a second conductive material, such as a metal, such as tungsten, ruthenium, molybdenum, cobalt, aluminum, nickel, copper, silver, gold, alloys thereof, or the like. The material of the liner layers 128 is one that has good adhesion to the material of the dielectric layers 106, and the material of the main layers 130 is one that has good adhesion to the material of the liner layers 128 and also has a low resistivity. In some embodiments, the liner layers 128 are formed of titanium nitride and the main layers 130 are formed of tungsten. The materials of the liner layers 128 and the main layers 130 may be formed by acceptable deposition processes such as chemical vapor deposition (CVD), atomic layer deposition (ALD), or the like. For example, the liner layers 128 may be deposited in the trenches 122 and around the dielectric layers 106 using a conformal deposition process such as ALD, and the main layers 130 may be subsequently deposited on the liner layers 128 using a conformal deposition process such as ALD. Any acceptable etch process, such as a dry etch (e.g., a reactive ion etch (RIE), neutral beam etch (NBE), the like), a wet etch, the like, or a combination thereof, may be performed to remove excess material in the trenches 122 from the sidewalls of the dielectric layers 106. The etching may be anisotropic. The thickness of the liner layers 128 may be less than the thickness of the main layer 130.

Although not separately illustrated in FIG. 13, it should be appreciated that the word lines 126 are conductive lines which extend in the Y-direction. The word lines 126 have similar lengths as the sacrificial layers 108 which they replaced. Due to the staircase shape of the staircase structure 114 (see, e.g., FIG. 11), the word lines 126 may have varying lengths that increase in a direction towards the substrate 102. For example, the word lines 126A may be longer than the word lines 126B, and the word lines 126B may be longer than the word lines 126C.

As will be subsequently described for FIGS. 14-16, conductive spacers 136 (see FIG. 16) will be formed on the sidewalls of the word lines 126. The conductive spacers 136 are formed of a work function material, which may be selected to tune the work function of the transistors 54 (see FIGS. 1A-1B) to a desired amount. The threshold voltages of the transistors 54 may thus be more accurately tuned. In this embodiment, the conductive spacers 136 are formed by a single-patterning process. The single-patterning process includes recessing the word lines 126 to form sidewall recesses 132 (see FIG. 14), filling the sidewall recesses 132 with a conductive layer 134 (see FIG. 15), and removing excess material of the conductive layer 134 in the trenches 122 to form the conductive spacers 136 (see FIG. 16). The conductive spacers 136 may be formed by other acceptable processes. In another embodiment (subsequently described for FIGS. 23-24), the conductive spacers 136 are formed by a multiple-patterning process.

Figure 14:
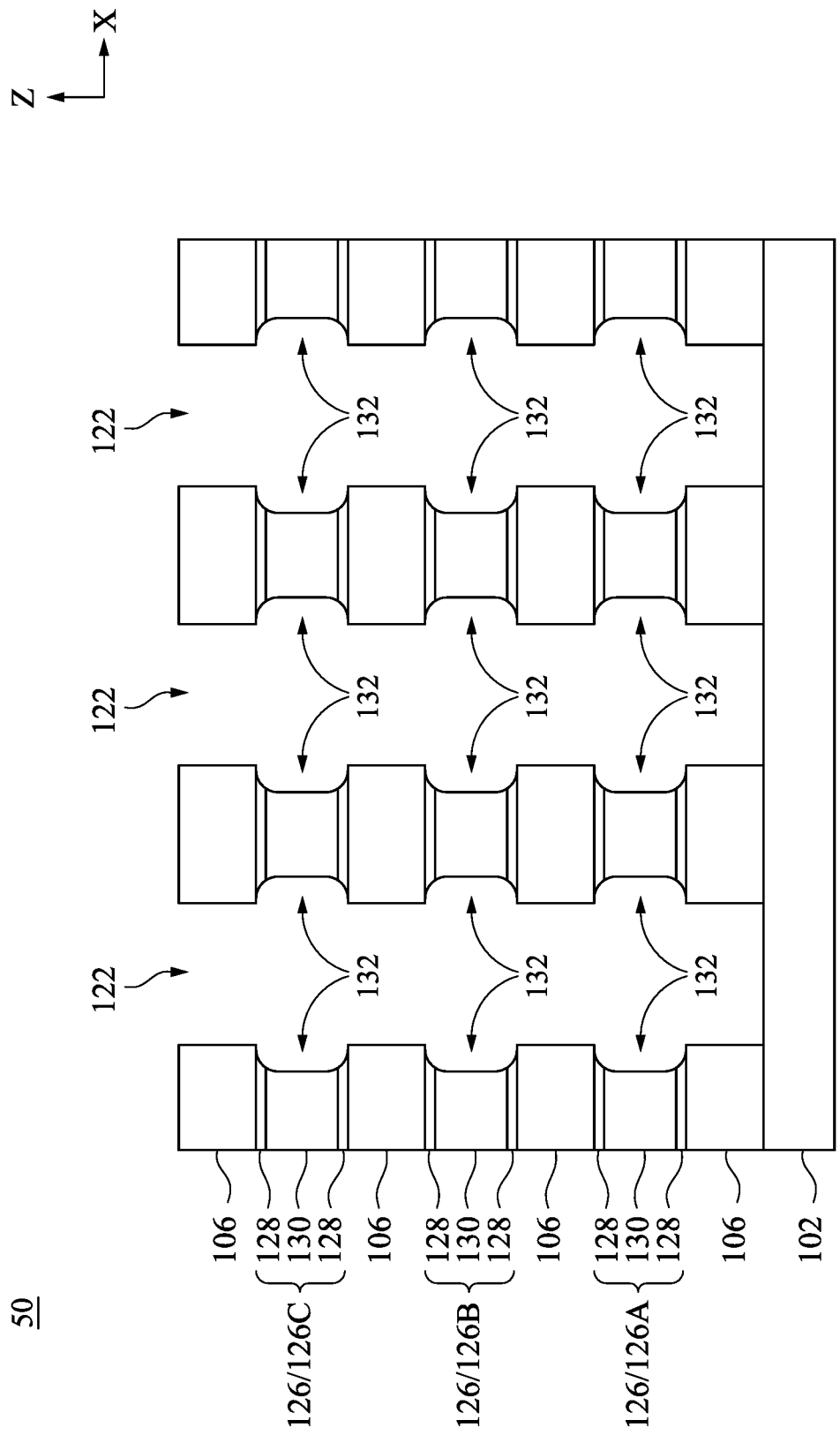

In FIG. 14, the trenches 122 are expanded to form sidewall recesses 132 for conductive spacers between the dielectric layers 106. Specifically, portions of the sidewalls of the word lines 126 exposed by the trenches 122 are recessed from the portions of the sidewalls of the dielectric layers 106 exposed by the trenches 122 to form the sidewall recesses 132. The sidewalls recesses 132 may expose the top and bottom surfaces of the dielectric layers 106. Although sidewalls of the word lines 126 are illustrated as being concave, the sidewalls may be straight or convex. The sidewall recesses 132 may be formed by any acceptable etching process, such as one that is selective to the material(s) of the word lines 126 (e.g., selectively removes the material(s) of the word lines 126 at a faster rate than the material of the dielectric layers 106). The etching may be isotropic. In embodiments where the word lines 126 include liner layers 128 formed of titanium nitride and main layers 130 formed of tungsten, and where the dielectric layers 106 are formed of silicon oxide, the trenches 122 can be expanded by a dry etch using fluorine-based etchants (e.g., $CF_4$, $SF_6$, etc.) and/or chlorine-based etchants (e.g., $Cl_2$) without generating a plasma. In another embodiment, a wet etch selective to the material(s) of the word lines 126 may be used. In this embodiment, each of the sidewall recesses 132 are formed by a same patterning process.

After formation, the sidewall recesses 132 have a depth Di in the X-direction, extending past the sidewalls of the dielectric layers 106. Timed etch processes may be used to stop the etching of the sidewall recesses 132 after the sidewall recesses 132 reach a desired depth Di. In some embodiment, the sidewall recesses 132 have a depth Di in the range of 1 nm to 5 nm. As will be subsequently described in greater detail, a work function material will be formed in the sidewall recesses 132. In some embodiments where the word lines 126 include liner layers 128 formed of titanium nitride and main layers 130 formed of tungsten, the sidewall recesses 132 can be D-shaped. The sidewall recesses 132 can be D-shaped as a result of the liner layers 128 being recessed by a lesser distance than the main layers 130. For example, the etching process used to pattern the sidewall recesses 132 may remove the material of the main layers 130 at a faster rate than the material of the liner layers 128. In other embodiments, the sidewall recesses 132 can have other shapes.

Figure 15:
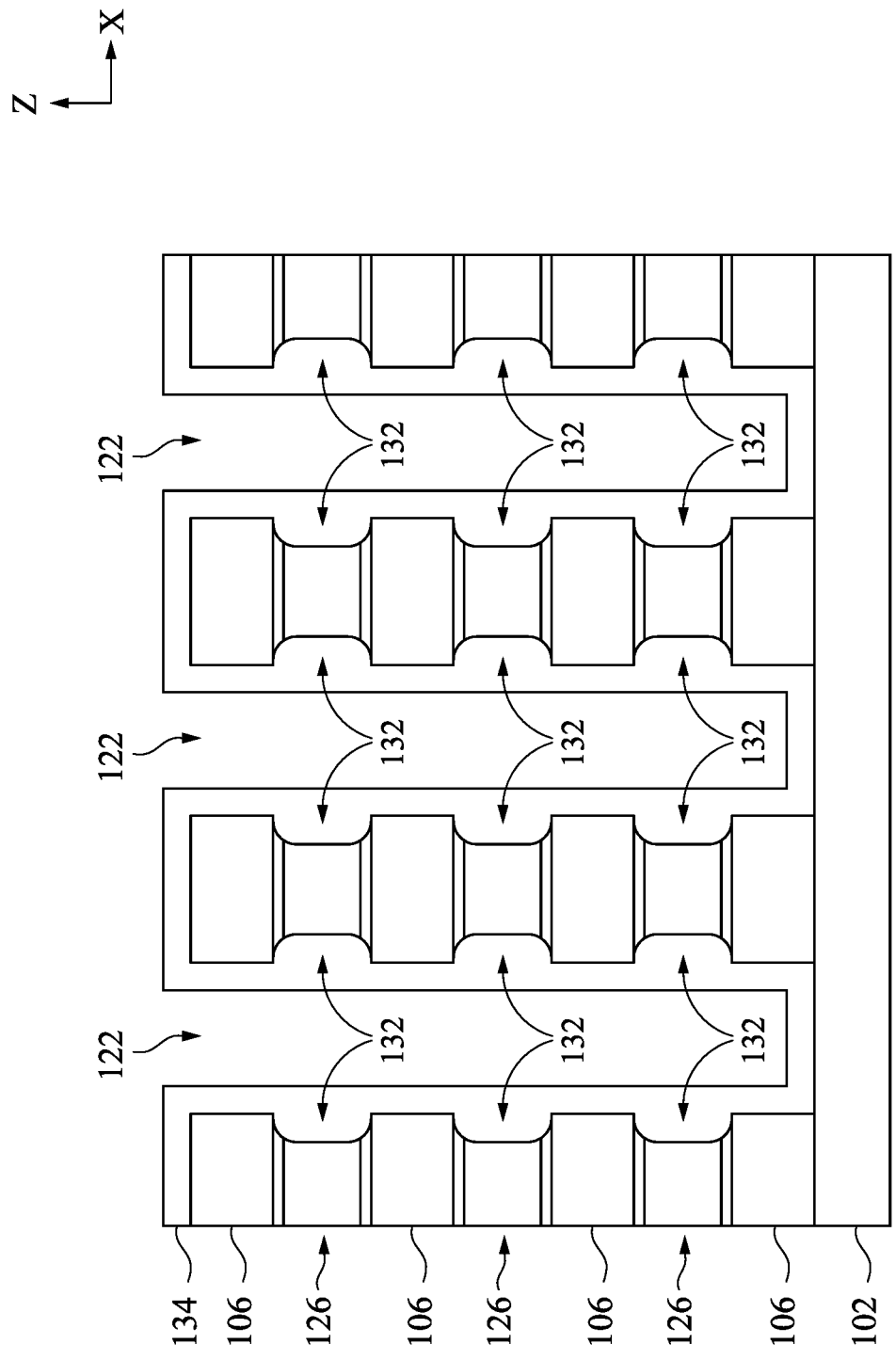

In FIG. 15, a conductive layer 134 for conductive spacers is formed in the sidewall recesses 132 and the trenches 122. The conductive layer 134 may contact the top and bottom surfaces of the dielectric layers 106, and the sidewalls of the word lines 126. The conductive layer 134 may be formed in the sidewall recesses 132 by depositing the conductive layer 134 in the trenches 122 and the sidewall recesses 132 until the sidewall recesses 132 are filled (or overfilled). The conductive layer 134 may be formed of any acceptable work function material to tune a work function of a transistor to a desired amount given the application of the transistor to be formed, which may be deposited by any acceptable deposition process. The material of the conductive layer 134 has a different work function than the material(s) of the word lines 126. In some embodiments, the conductive layer 134 is formed of a metal or a metal nitride, such as cobalt (Co), ruthenium (Ru), tungsten (W), tungsten nitride ($WN_{0.8}$), tungsten carbonitride (WCN), molybdenum (Mo), molybdenum nitride (MoN), titanium nitride (TiN), combinations thereof, or the like, which may be deposited by ALD, CVD, PVD, or the like. In some embodiments, the conductive layer 134 is formed of a metal having a work function in the range of 4.5 eV to 5 eV, such as a work function of at least 4.7 eV. Although the conductive layer 134 is shown as being single layered, the conductive layer 134 can be multilayered.

The material of the conductive layer 134 is one that may be deposited at a low temperature. In some embodiments, the material of the conductive layer 134 may be deposited at a temperature of at most (e.g., less than or equal to) 500° C., to meet a BEOL thermal budget and reduce defects which may result in other features from high-temperature deposition. For example: cobalt may be deposited by PECVD at less than about 200° C.; ruthenium may be deposited by CVD at less than about 200° C.; tungsten may be deposited by ALD at about 350° C.; tungsten nitride may be deposited by ALD at about 400° C.; tungsten carbonitride may be deposited by ALD at about 400° C.; molybdenum may be deposited by ALD at from about 430° C. to about 500° C.; molybdenum nitride may be deposited by ALD at from about 400° C. to about 500° C.; and titanium nitride may be deposited by ALD at about 430° C.

Figure 16:
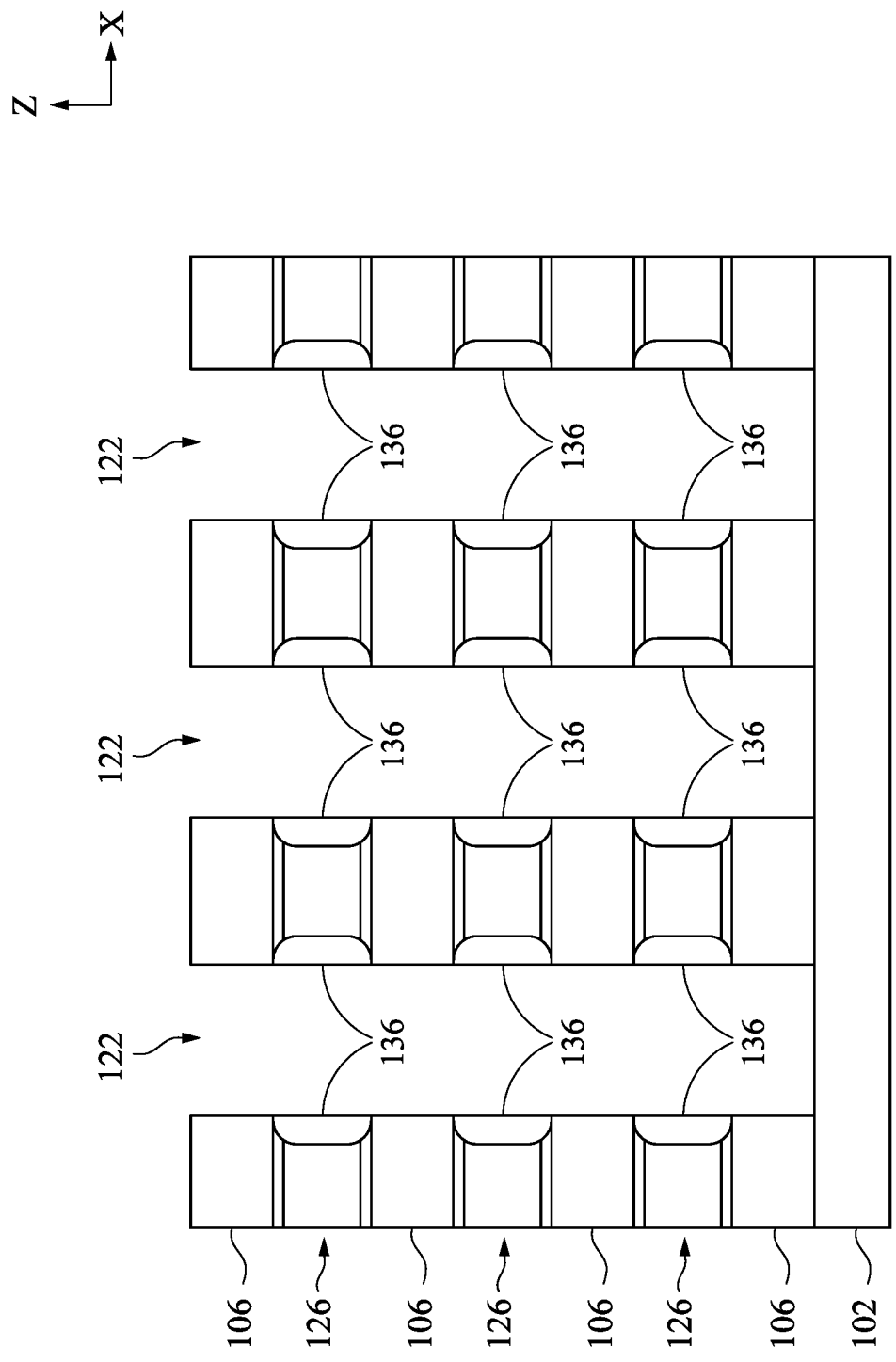

In FIG. 16, excess material of the conductive layer 134 in the trenches 122 is removed to form conductive spacers 136. Specifically, portions of the conductive layer 134 in the trenches 122, such as those portions on the sidewalls of the dielectric layers 106, are removed. Any acceptable etch process, such as a dry etch (e.g., a reactive ion etch (RIE), neutral beam etch (NBE), the like), a wet etch, the like, or a combination thereof, may be performed to remove the excess material of the conductive layer 134. The etching may be anisotropic. After the etching, the conductive layer 134 has portions remaining in the sidewall recesses 132 (thus forming the conductive spacers 136). In some embodiment, the conductive spacers 136 have a thickness in the X-direction which is in the range of 1 nm to 5 nm. The conductive spacers 136 are disposed on the sidewalls of the word lines 126, and will separate the word lines 126 from a subsequently formed memory film. The gate electrodes of the transistors 54 (see FIGS. 1A-1B) are provided by a combination of the word lines 126 and the conductive spacers 136, with the conductive spacers 136 providing work function tuning layers of the gate electrodes. As will be subsequently described in greater detail, the conductive spacers 136 allow the word lines 126 to be electrically connected to a portion of the memory film while preventing the word lines 126 from physically contacting the portion of the memory film. Although the outer sidewalls of the conductive spacers 136 are illustrated as being flush with respect to the sidewalls of the dielectric layers 106, the outer sidewalls of the conductive spacers 136 may extend beyond or be recessed from the sidewalls of the dielectric layers 106. In other words, the conductive spacers 136 may partially fill, completely fill, or overfill the sidewall recesses 132. Moreover, although the sidewalls of the conductive spacers 136 are illustrated as being concave, the sidewalls of the conductive spacers 136 may be straight or convex.

Figure 17:
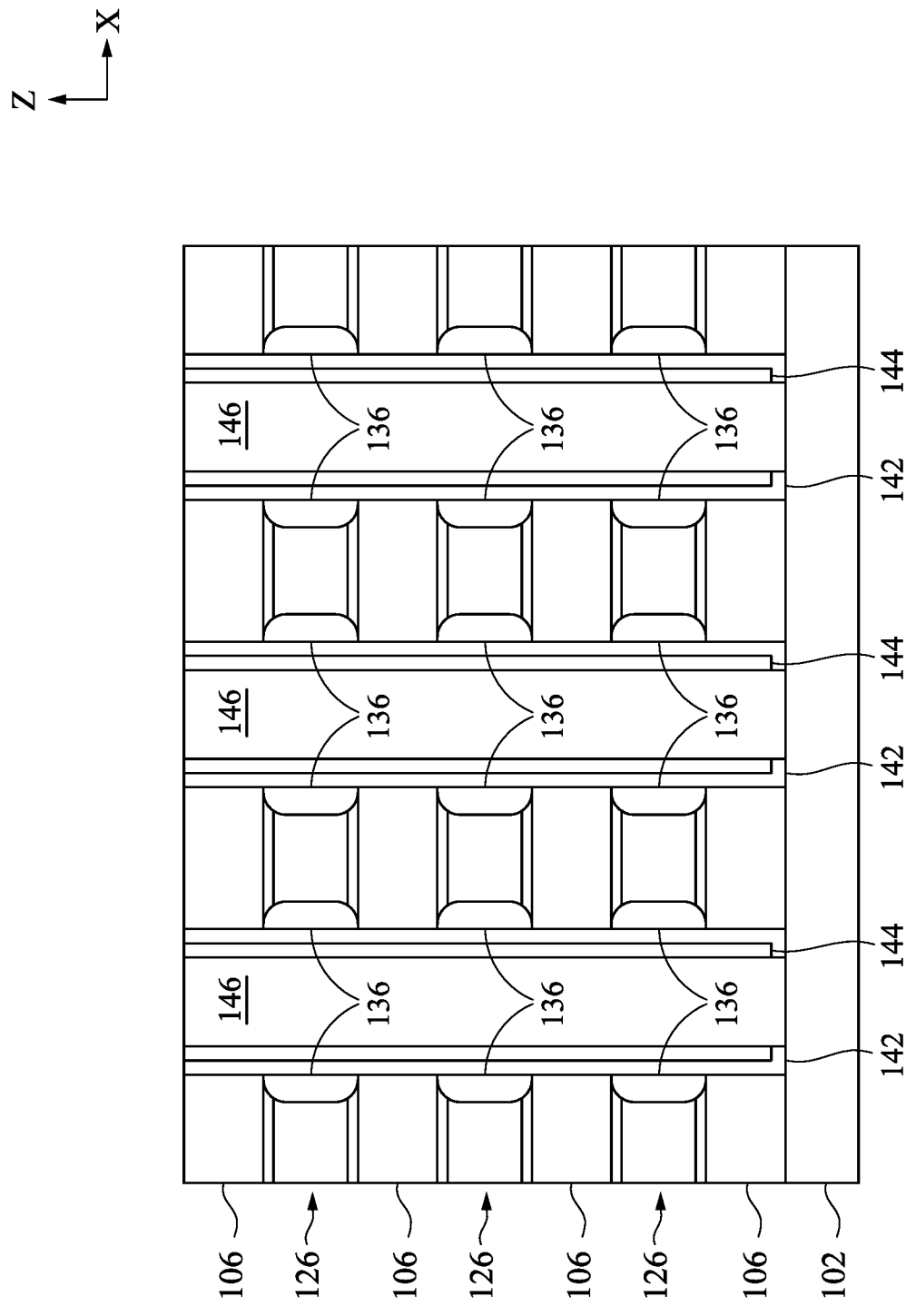

In FIG. 17, memory films 142, semiconductor films 144, and isolation regions 146 are formed in the trenches 122. The memory films 142 are formed over the substrate 102, on the sidewalls of the dielectric layers 106, and on the sidewalls of the conductive spacers 136. The semiconductor films 144 are formed on the sidewalls of the memory films 142. Portions of the memory films 142 provide gate dielectrics for the transistors 54 (see FIGS. 1A-1B) and portions of the semiconductor films 144 provide channel regions for the transistors 54. The isolation regions 146 extend through the semiconductor films 144, thus separating the semiconductor films 144 of horizontally adjacent transistors 54 along the X-direction. In the illustrated embodiment, the isolation regions 146 extend through the memory films 142, thus also separating the memory films 142 of horizontally adjacent transistors 54 along the along the X-direction. In another embodiment, the isolation regions 146 are formed on the memory films 142 and do not extend through the memory films 142.

The memory films 142 are formed of any acceptable material for storing a digital value, such as material capable of switching between two different polarization directions by applying an appropriate voltage differential across the material. For example, the polarization of the material may change due to an electric field resulting from applying the voltage differential. In some embodiments, the memory films 142 are formed of a high-k ferroelectric material, such as a hafnium (Hf) based dielectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some embodiments, the memory films 142 are multilayer structures including a layer of silicon nitride between two silicon oxide layers (e.g., an oxide-nitride-oxide structure). Other acceptable memory materials may be utilized. The material of the memory films 142 may be formed by any acceptable deposition process such as ALD, CVD, PVD, or the like. In some embodiments, the memory films 142 are formed to a thickness in the range of 3 nm to 20 nm. The memory films 142 may be formed to a greater thickness than the conductive spacers 136.

The semiconductor films 144 formed of any acceptable material for providing channel regions for transistors. The semiconductor films 144 may be formed of a thin film semiconductor material suitable for providing a channel region for a thin film transistor (TFT). In some embodiments, the semiconductor films 144 are formed of an oxide semiconductor, such as an indium-based semiconductor material, such as indium gallium zinc oxide (IGZO), indium tin oxide (ITO), indium gallium zinc tin oxide (IGZTO), zinc oxide (ZnO), or the like. In some embodiments, the semiconductor films 144 are formed of a silicon-based semiconductor material, such as polysilicon, amorphous silicon, or the like. Other acceptable semiconductor materials may be utilized. The material of the semiconductor films 144 may be formed by any acceptable deposition process such as ALD, CVD, PVD, or the like. In some embodiments, the semiconductor films 144 are formed to a thickness in the range of 3 nm to 20 nm. The semiconductor films 144 may be formed to a greater thickness than the conductive spacers 136.

The isolation regions 146 are formed of any acceptable material for protecting and electrically isolating the memory films 142. Acceptable dielectric materials for the isolation regions 146 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other acceptable dielectric materials may be utilized. The material of the isolation regions 146 may be formed by any acceptable deposition process such as ALD, CVD, flowable CVD (FCVD), or the like.

The memory films 142, the semiconductor films 144, and the isolation regions 146 may be formed by a combination of deposition, etching, and planarization. For example, a memory layer can be conformally deposited in the trenches 122 (e.g., on the sidewalls of the conductive spacers 136 and the sidewalls of the dielectric layers 106). A semiconductor layer can then be conformally deposited on the memory layer. The semiconductor layer can then be patterned by a suitable etching process, such as an anisotropic etch using the memory layer as an etch stop layer. The memory layer can then be patterned by a suitable etching process, such as an anisotropic etch using the patterned semiconductor layer as an etching mask. An isolation material can then be conformally deposited in the remaining portions of trenches 122 (e.g., on the patterned semiconductor layer and the exposed portions of the memory layer). A removal process is then applied to the various layers to remove excess materials over the upper dielectric layers 106/word lines 126. The portions of the memory layer, the semiconductor layer, and the isolation material remaining in the trenches 122 after the removal process form the memory films 142, the semiconductor films 144, and the isolation regions 146, respectively. The removal process may be a planarization process such as a chemical mechanical polish (CMP) process, an etch-back process, combinations thereof, or the like. After the planarization process, the top surfaces of the memory films 142, the semiconductor films 144, the isolation regions 146, and the upper dielectric layers 106/word lines 126 are coplanar (within process variations) such that they are level with one another.

As previously noted, the conductive spacers 136 are formed of a work function material. The work function material of the conductive spacers 136 is selected based on a desired work function for the transistors 54 (see FIGS. 1A-1B). The threshold voltages of the transistors 54 may thus be more accurately tuned. Specifically, the threshold voltages of the transistors 54 may be tuned to a threshold voltage that allows the polarization direction of the memory films 142 to be more easily changed. In some embodiments, the work function material of the conductive spacers 136 has a work function in the range of 4.5 eV to 5 eV, such as a work function of at least 4.7 eV. Some materials with a desired work function have a high resistivity. For example, titanium nitride has a work function of about 4.6 eV, but has a resistivity of about 300 μΩ·cm. Forming the conductive spacers 136 (instead of the word lines 126) of the work function material allows the transistors 54 to include a material having a desired work function, while reducing the amount of high resistivity material utilized. The word lines 126 may thus be formed of a material with a low resistivity such as tungsten. As such, the material of the word lines 126 advantageously has a lower resistivity than the material of the conductive spacers 136. Reducing the resistance of the word lines 126 helps increase the performance of the memory array 50.

Further, the material of the conductive spacers 136 is one that has good adhesion to the materials of the word lines 126 and the memory films 142. The material of the memory films 142 may adhere better to the material of the conductive spacers 136 than to the material of the word lines 126. The quantity of interface traps between the gate dielectrics and the gate electrodes of the transistors 54 (see FIGS. 1A-1B) may thus be reduced. Decreasing the quantity of interface traps may increase the endurance of the memory films 142, allowing them to sustain more read/write cycles and increasing the lifespan of the memory array 50.

Figure 18A:
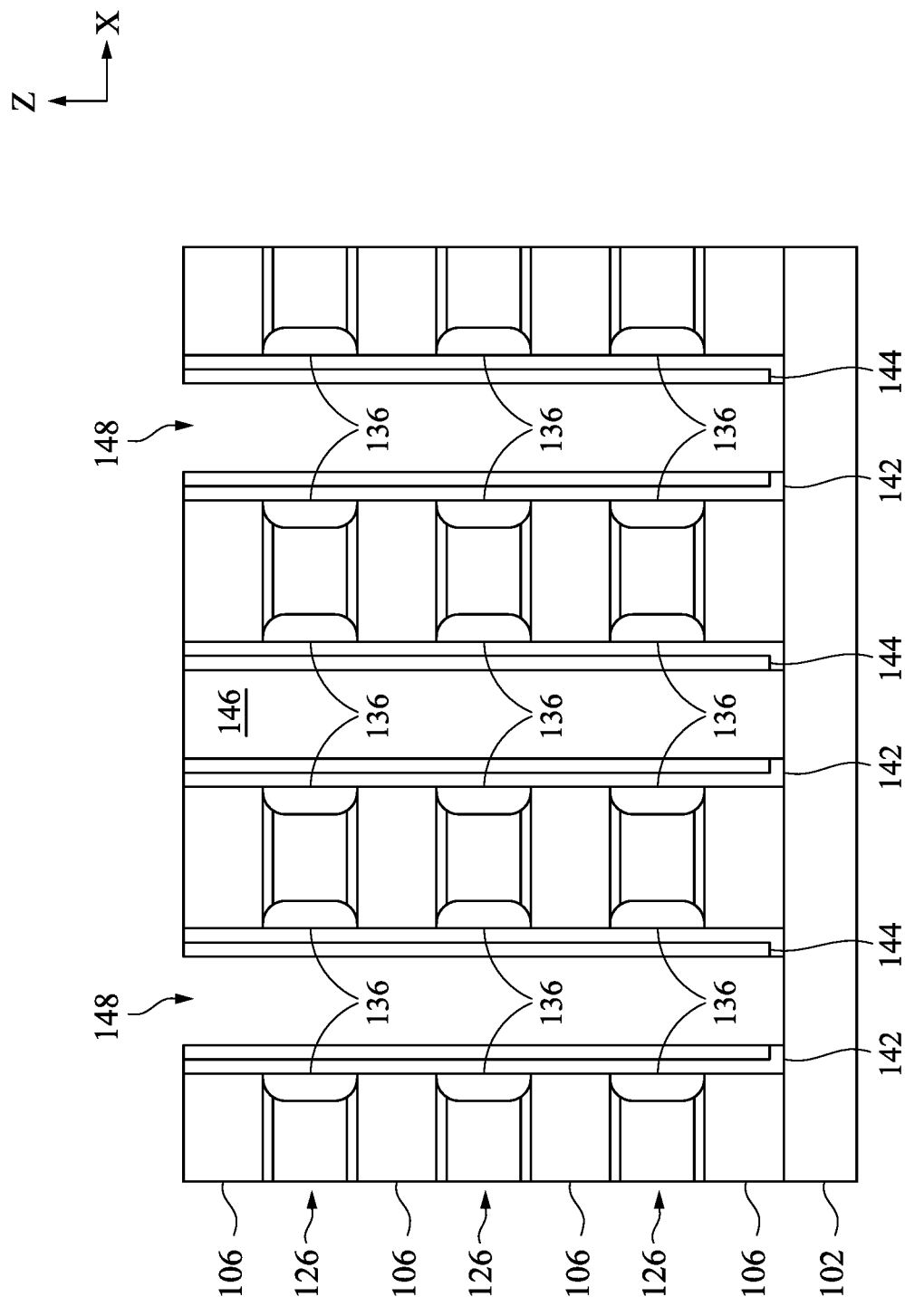

In FIGS. 18A-18B, openings 148 for conductive lines are formed through the isolation regions 146. The openings 148 may be formed with an etching process that is selective to the isolation regions 146 (e.g., selectively removes the material of the isolation regions 146 at a faster rate than the materials of the memory films 142 and the semiconductor films 144). The etching may be any acceptable etch process, such as by wet or dry etching, a reactive ion etch (RIE), neutral beam etch (NBE), the like, or a combination thereof. The etching may be anisotropic. For example, the openings 148 may be formed through the isolation regions 146 by a dry etch using ammonia ($NH_3$) and hydrogen fluoride (HF) gas, which may be performed using an etching mask having a pattern of the subsequently formed conductive lines.

Figure 19A:
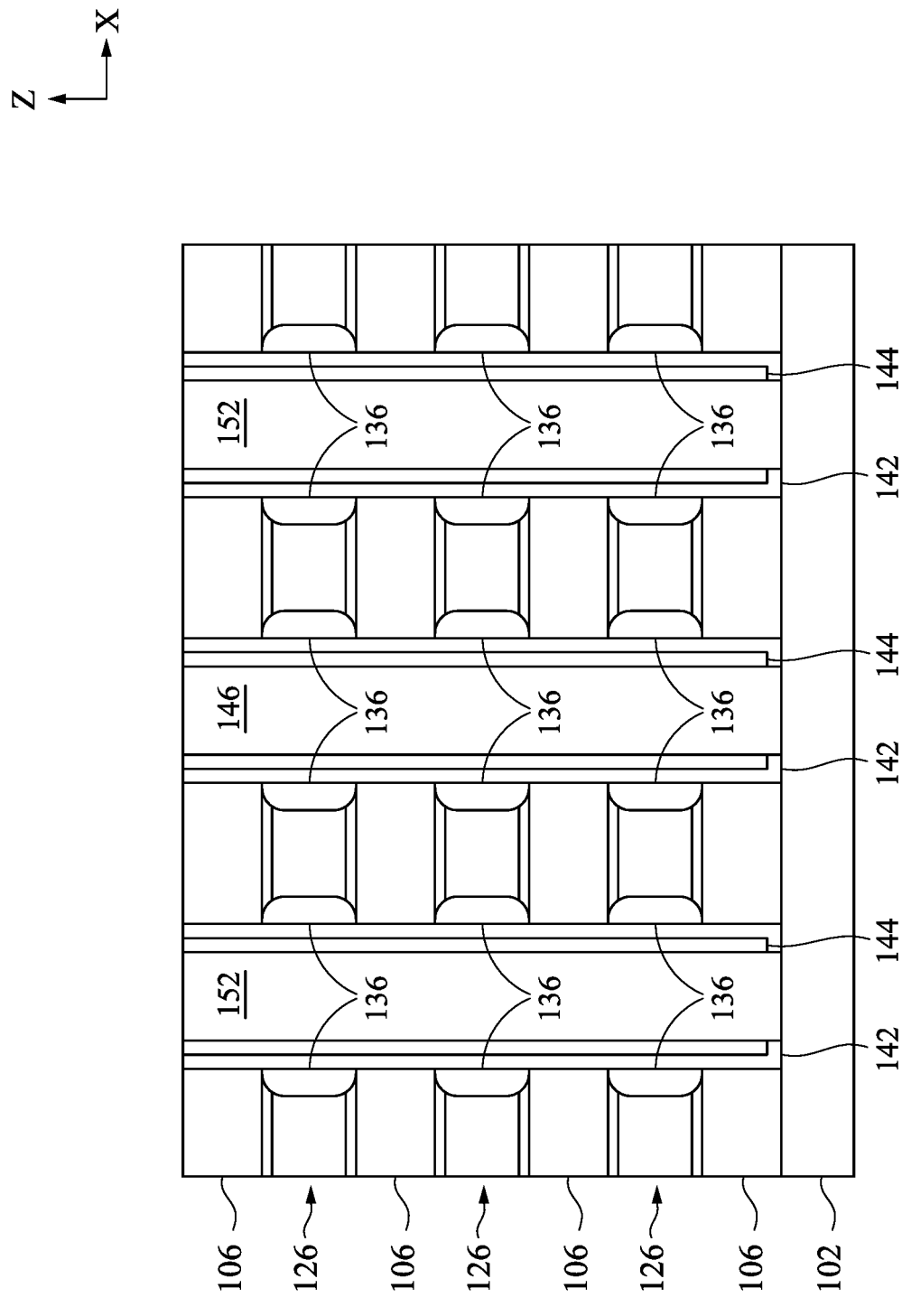
Figure 19B:
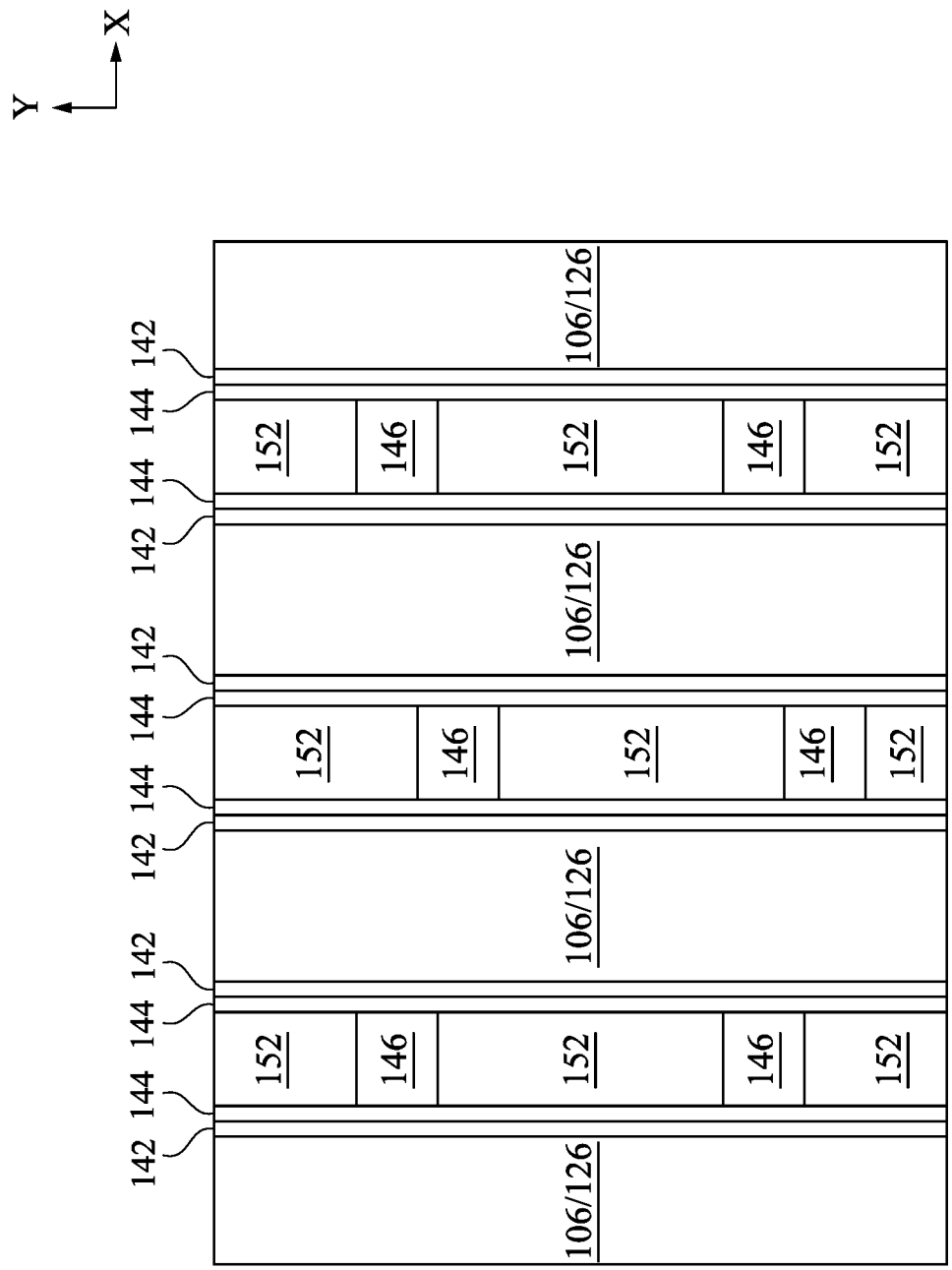

In FIGS. 19A-19B, conductive lines 152 are formed in the openings 148, on the sidewalls of the semiconductor films 144. The conductive lines 152 thus extend through the isolation regions 146. As discussed in greater detail below, the conductive lines 152 are columns which extend in the Z-direction, and will be divided into bit lines and source lines for the transistors 54 (see FIGS. 1A-1B). As such, the conductive lines 152 are formed in contact with portions of the semiconductor films 144, so that the bit lines and the source lines will adjoin the channel regions of the transistors 54. In embodiments where the isolation regions 146 extend through the memory films 142, the conductive lines 152 are also formed in contact with portions of the memory films 142.

As an example to form the conductive lines 152, a liner, such as a diffusion barrier layer, an adhesion layer, or the like, and a main layer are formed in the openings 148. The liner may be formed of a conductive material, such as a metal or a metal nitride, such as titanium, titanium nitride, tantalum, tantalum nitride, or the like, which may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The main layer may be formed of a conductive material, such as a metal, such as tungsten, cobalt, ruthenium, aluminum, nickel, copper, a copper alloy, silver, gold, or the like, which may be deposited by ALD, CVD, PVD, or the like. In some embodiments, the conductive lines 152 and the word lines 126 include a same conductive material (e.g., tungsten). In some embodiments, the conductive lines 152 include a liner formed of titanium nitride and a main layer formed of tungsten. A removal process is then applied to the various layers to remove excess material(s) of the conductive lines 152 over the upper dielectric layers 106/word lines 126, the memory films 142, the semiconductor films 144, and the isolation regions 146. The material(s) remaining in the openings 148 after the removal process form the conductive lines 152. The removal process may be a planarization process such as a chemical mechanical polish (CMP) process, an etch-back process, combinations thereof, or the like. After the planarization process, the top surfaces of the upper dielectric layers 106/word lines 126, the memory films 142, the semiconductor films 144, the isolation regions 146, and the conductive lines 152 are coplanar (within process variations) such that they are level with one another.

Figure 20A:
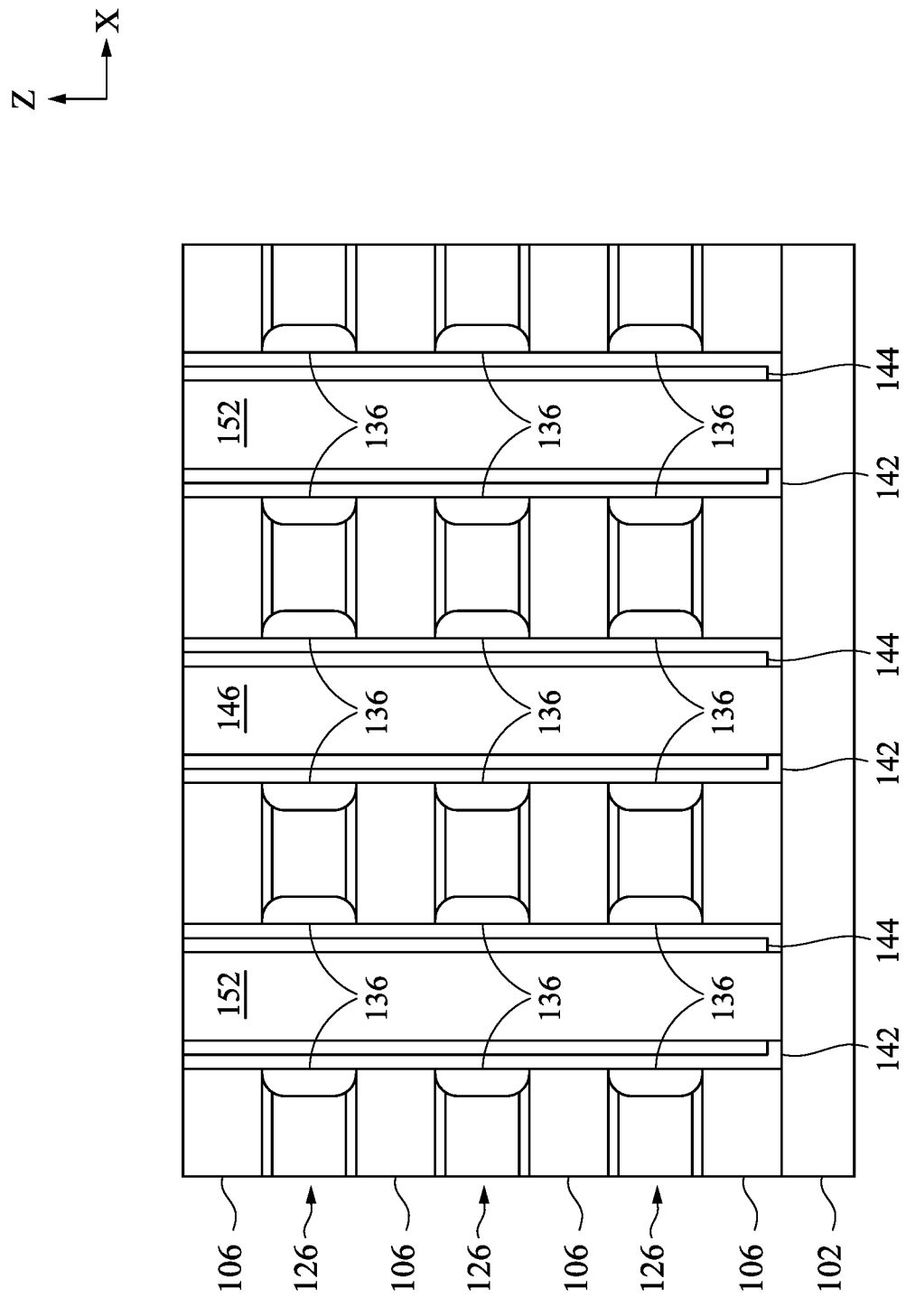
Figure 20B:
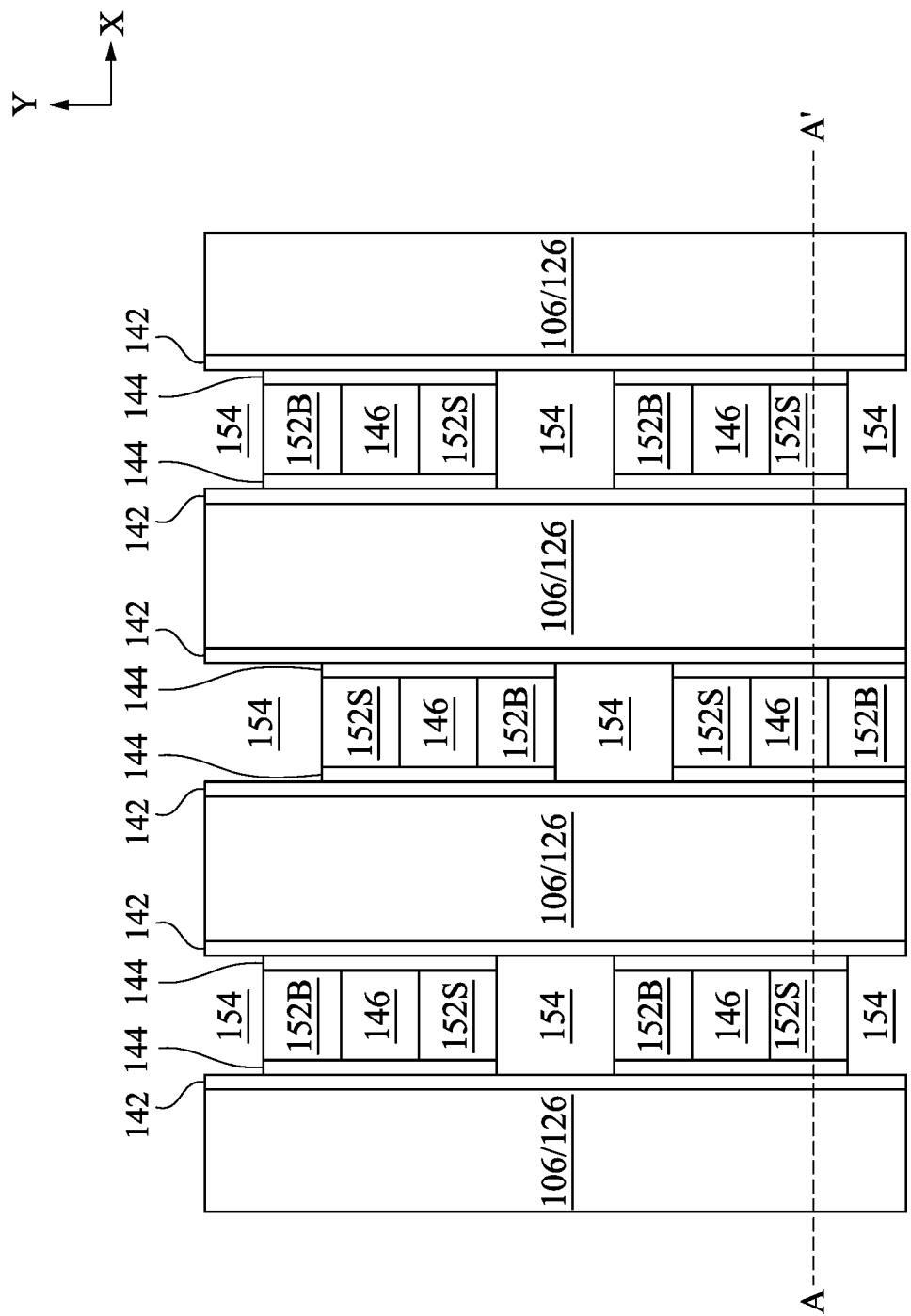

In FIGS. 20A-20B, openings 154 for isolation regions are formed through the conductive lines 152. The openings 154 may also be formed through the semiconductor films 144. The openings 154 divide the semiconductor films 144 and the conductive lines 152 to form the transistors 54 (see FIGS. 1A-1B). Specifically, each conductive line 152 is divided to form a bit line 152B and a source line 152S. The openings 154 may divide the conductive lines 152 into bit lines 152B and source lines 152S of equal or unequal widths. As noted above, the bit lines 152B and the source lines 152S act as source/drain electrodes of the transistors 54. In the illustrated embodiment, the openings 154 do not extend through the memory films 142. In another embodiment, the openings 154 extend through the memory films 142 so that they also divide the memory films 142. After the openings 154 are formed, each transistor 54 includes a portion of a memory film 142, a portion of a semiconductor film 144, a portion of a bit line 152B, and a portion of a source line 152S.

In this embodiment, the bit lines 152B and the source lines 152S are formed in a staggered layout. Specifically, the bit lines 152B and the source lines 152S are laid out in an alternating pattern, and bit lines 152B/source lines 152S which are adjacent to one another along the X-direction are laterally offset from one another along the Y-direction. As will be subsequently described in greater detail, laterally offsetting the bit lines 152B and the source lines 152S from one another obviates the need for lateral interconnects when subsequently interconnecting the transistors to form functional memories. In another embodiment, the bit lines 152B and the source lines 152S are not formed in a staggered layout, such that bit lines 152B/source lines 152S which are adjacent to one another along the X-direction are laterally aligned along the Y-direction.

The openings 154 may be formed with an etching process that is selective to the semiconductor films 144 and/or the conductive lines 152 (e.g., selectively removes the materials of the semiconductor films 144 and/or the conductive lines 152 at a faster rate than the material of the memory films 142). The etching may be any acceptable etch process, such as by wet or dry etching, a reactive ion etch (RIE), neutral beam etch (NBE), the like, or a combination thereof. The etching may be anisotropic. For example, the openings 154 may be formed by a dry etch using, e.g., $C_4F_6$ mixed with hydrogen ($H_2$) or oxygen ($O_2$) gas, which may be performed using an etching mask having a pattern of the subsequently formed isolation regions.

Figure 21A:
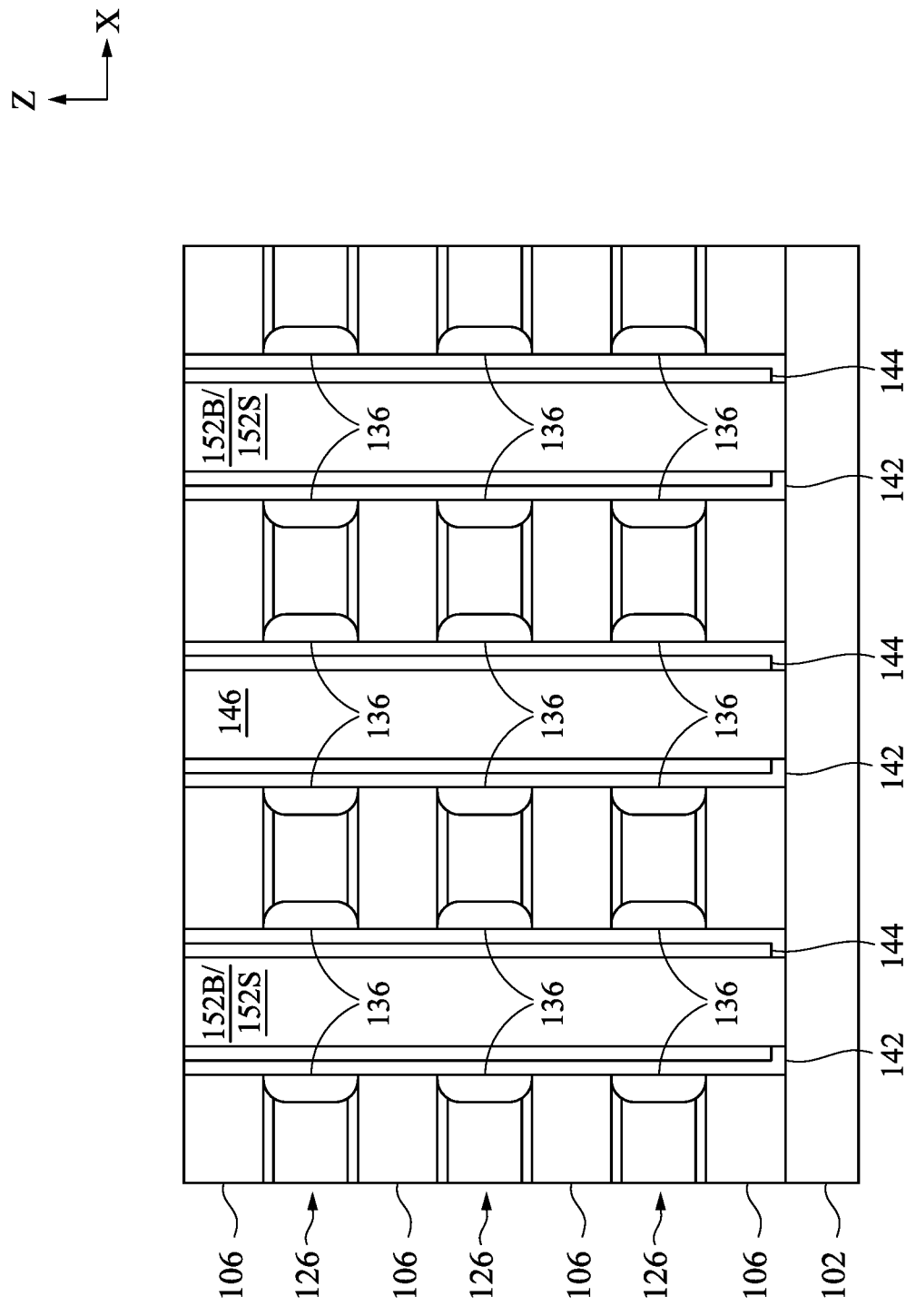
Figure 21B:
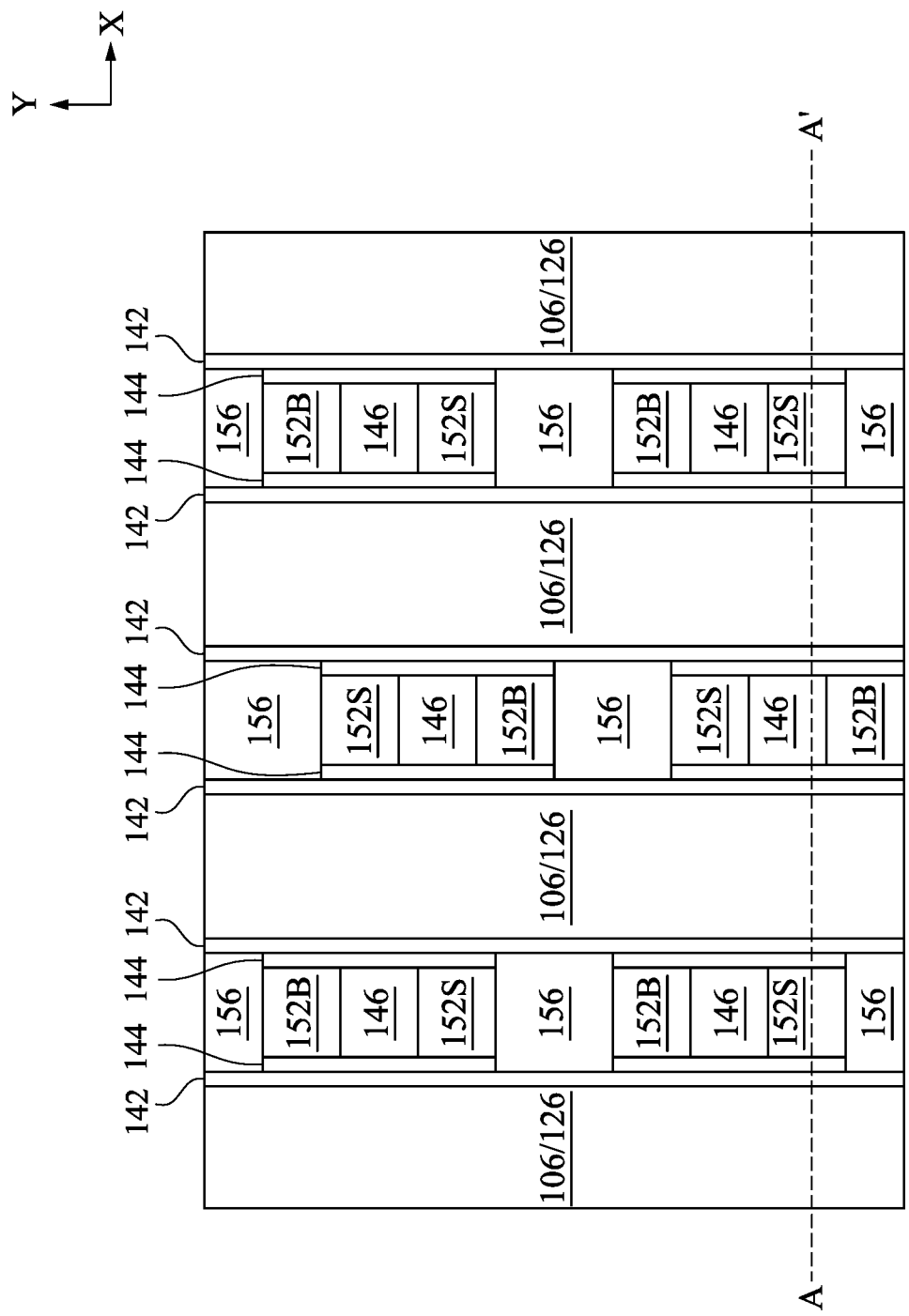

In FIGS. 21A-21B, isolation regions 156 are formed in the openings 154. The isolation regions 156 thus extend through the conductive lines 152 and the semiconductor films 144. As an example to form the isolation regions 156, an isolation material is formed in the openings 154. The isolation material may be formed of oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like, which may be deposited by CVD, ALD, or the like. In some embodiments, the isolation regions 156 are formed of silicon oxide. A removal process is then applied to the various layers to remove excess isolation material over the upper dielectric layers 106/word lines 126, the memory films 142, the semiconductor films 144, the isolation regions 146, the source lines 152S, and the bit lines 152B. The isolation material remaining in the openings 154 after the removal process forms the isolation regions 156. The removal process may be a planarization process such as a chemical mechanical polish (CMP) process, an etch-back process, combinations thereof, or the like. After the planarization process, the top surfaces of the upper dielectric layers 106/word lines 126, the memory films 142, the semiconductor films 144, the isolation regions 146, the source lines 152S, the bit lines 152B, and the isolation regions 156 are coplanar (within process variations) such that they are level with one another.

Figure 22A:
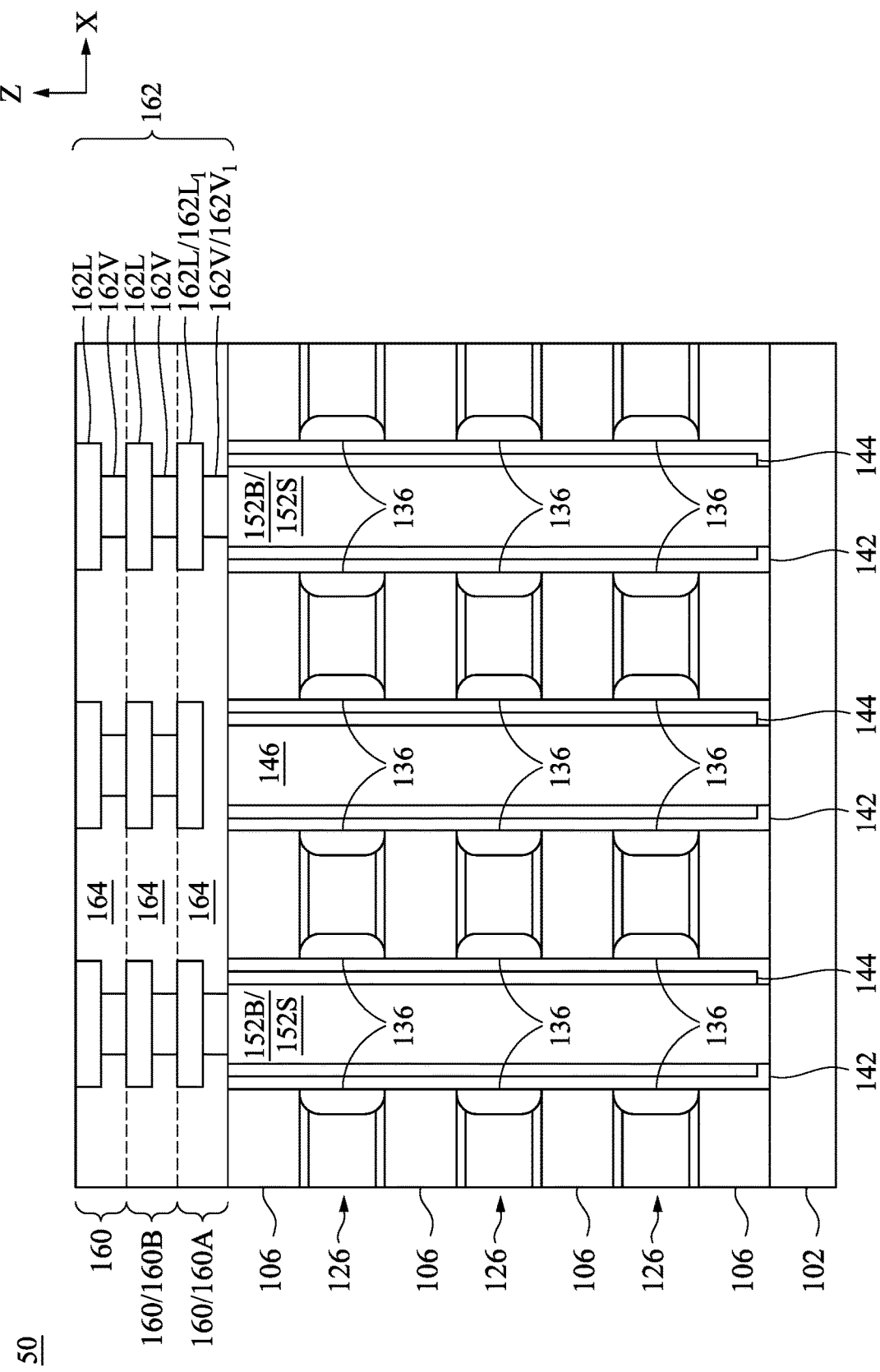
Figure 22B:
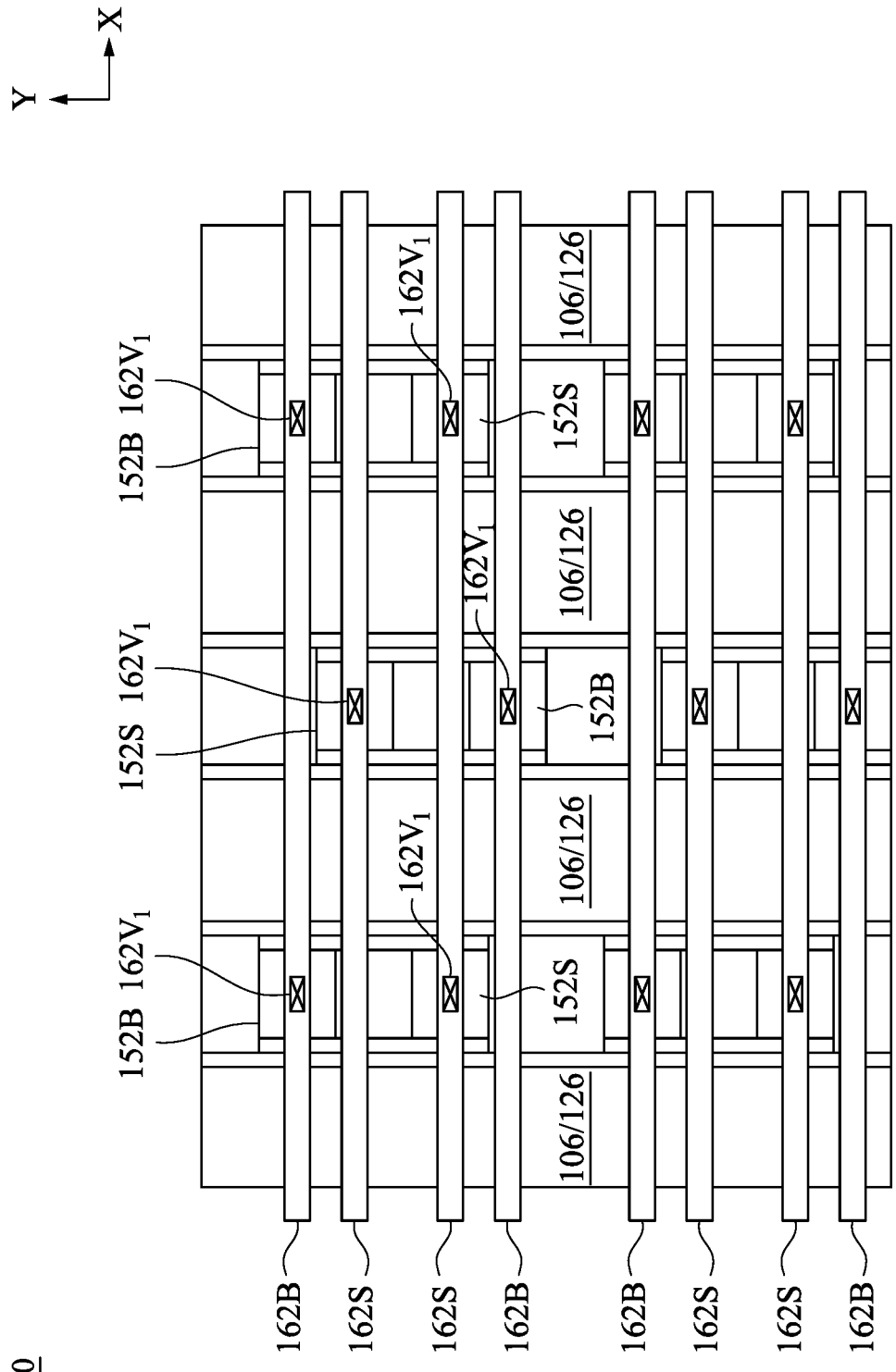
Figure 22C:
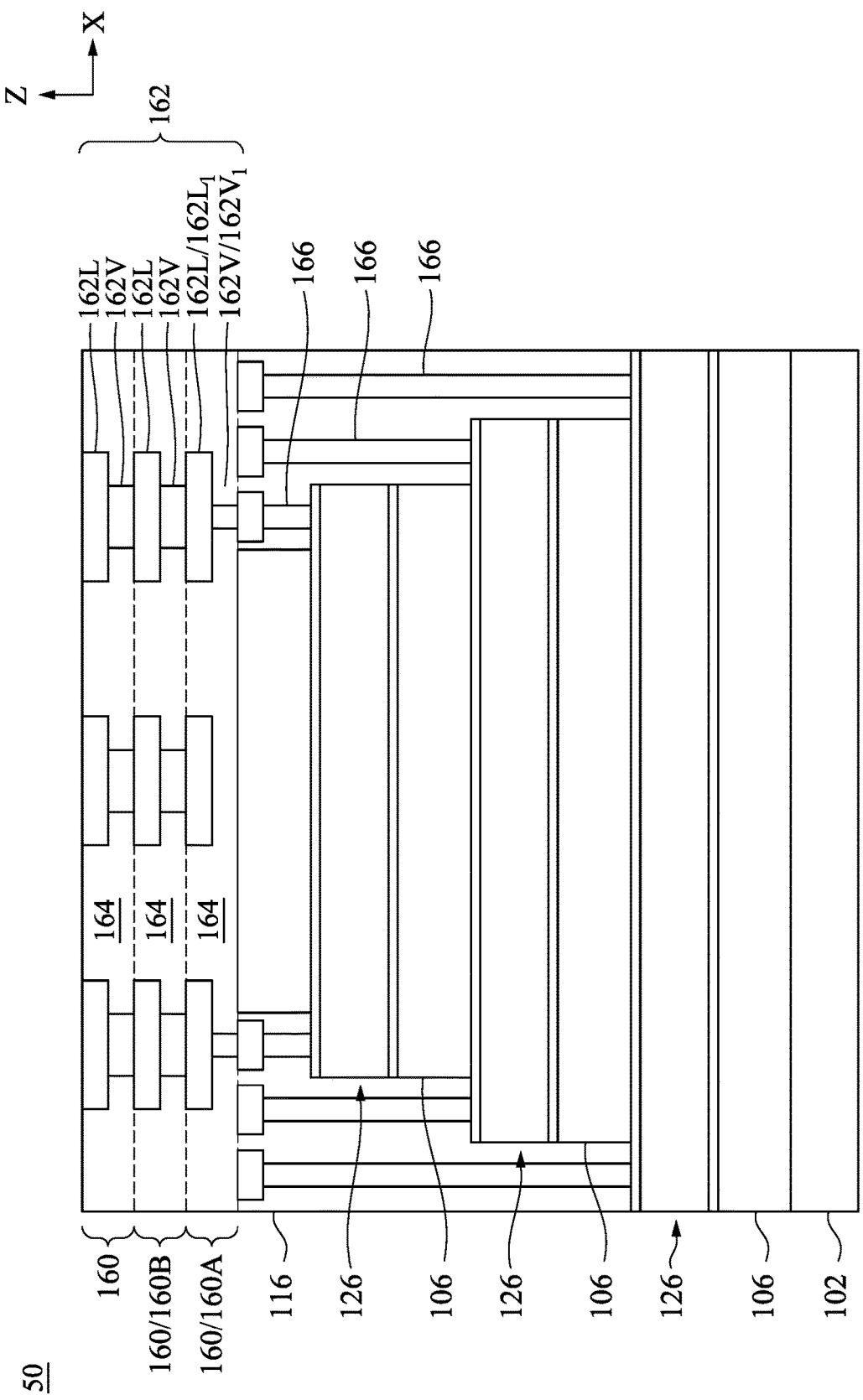

In FIGS. 22A-22C, one or more interconnect layer(s) 160 for an interconnect structure are formed over the intermediate structure. The interconnect layer(s) 160 each include interconnects 162 in a dielectric layer 164. The dielectric layers 164 may include one or more layers of dielectric material, such as one or more layers of a low-k (LK) or an extra low-K (ELK) dielectric material. The interconnects 162 may be metal interconnects (including conductive lines 162L and conductive vias 162V) formed in the dielectric layers 164. The interconnects 162 are connected to the bit lines 152B and the source lines 152S, and interconnect the transistors 54 to form functional memories. The interconnect layer(s) 160 may be formed by a damascene process, such as a single damascene process, a dual damascene process, or the like.

As noted above, the dielectric layers 106 and the word lines 126 may be formed in a staircase configuration. In such embodiments, conductive contacts 166 that are connected to the exposed portions of the word lines 126 may be formed in the IMD 116. For example, before the overlying interconnect layer(s) 160 are formed, the material of the IMD 116 may redeposited to fill any remaining portions of the trenches 122 (see FIG. 11), and the conductive contacts 166 may then be formed through the IMD 116. The conductive contacts 166 may be formed by a damascene process, such as a single damascene process, a dual damascene process, or the like.

The first-level conductive vias $162V_1$ are over and connected to the bit lines 152B the source lines 152S (see FIGS. 22A-22B). The first-level conductive vias $162V_1$ refers to those conductive vias 162V in the first interconnect layer 160A that is formed on the bit lines 152B, the source lines 152S, and the IMD 116. Further, the first-level conductive vias $162V_1$ are connected to the word lines 126, through the conductive contacts 166 (see FIG. 22C). The first-level conductive lines $162L_1$ are over and connected to the first-level conductive vias $162V_1$ (see FIG. 22B). The first-level conductive lines $162L_1$ refers to those conductive lines 162L in the first interconnect layer 160A. The first-level conductive lines $162L_1$ include bit line interconnects 162B (which are connected to the bit lines 152B), source line interconnects 162S (which are connected to the source lines 152S), and word line interconnects (not separately illustrated) (which are connected to the word lines 126). In embodiments where the bit lines 152B and the source lines 152S are formed in a staggered layout with an alternating pattern, the bit line interconnects 162B and the source line interconnects 162S may be formed as straight conductive lines. Lateral interconnects may thus be omitted from the interconnect layer(s) 160, allowing the bit line interconnects 162B and the source line interconnects 162S to be formed in the first interconnect layer 160A that is formed on the bit lines 152B and the source lines 152S. In another embodiment where the bit lines 152B and the source lines 152S are not formed in a staggered layout, the bit line interconnects 162B and the source line interconnects 162S may be formed in the second interconnect layer 160B that is formed on the bit lines 152B, the source lines 152S, and the IMD 116, and lateral interconnects may be formed in the first interconnect layer 160A to connect the bit line interconnects 162B and the source line interconnects 162S to the bit lines 152B and the source lines 152S, respectively.

Figure 23:
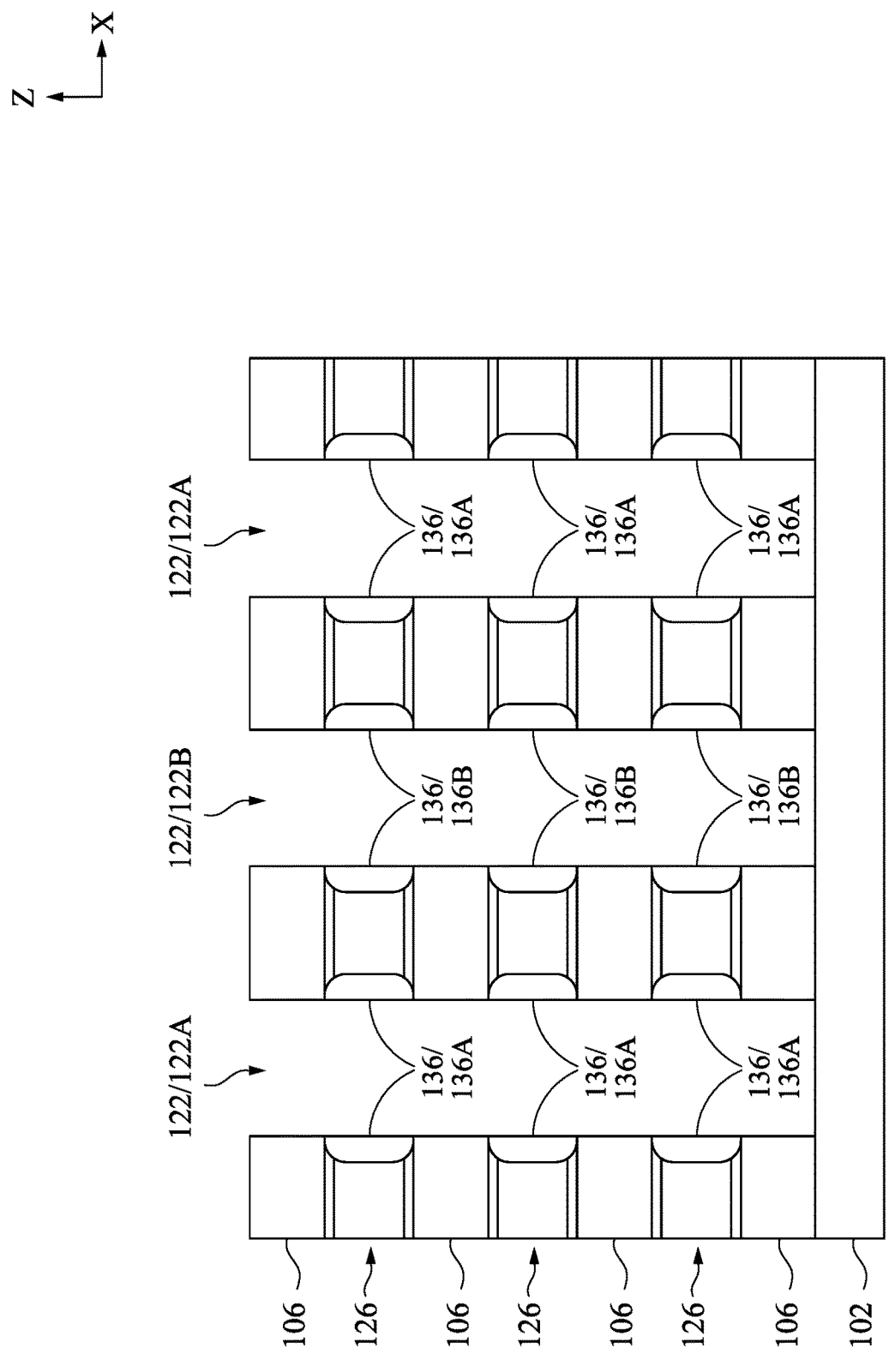
FIGS. 23-24 are views of intermediate stages in the manufacturing of a memory array, in accordance with some other embodiments.
Figure 24:
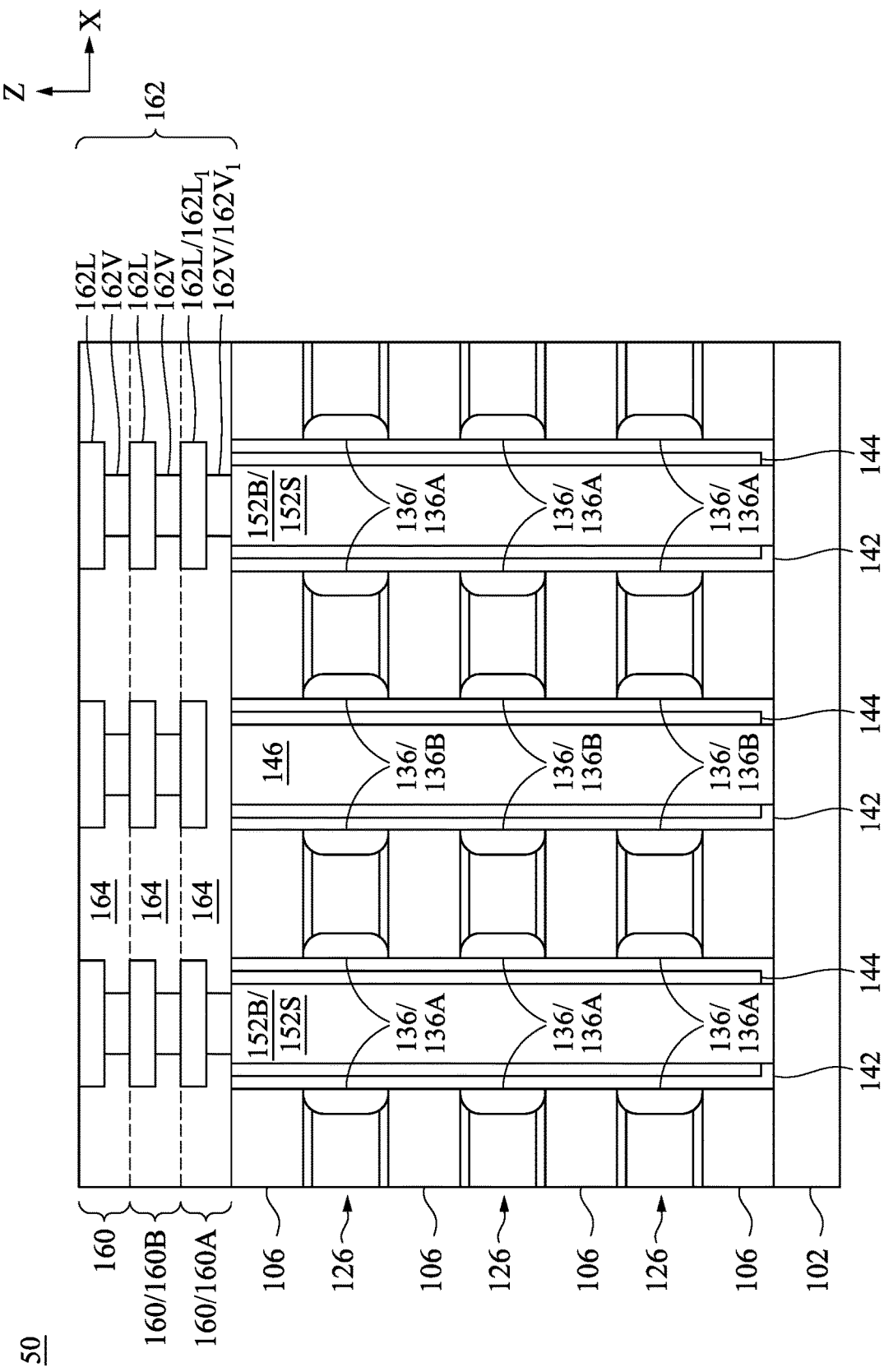

FIGS. 23-24 are views of intermediate stages in the manufacturing of a memory array 50, in accordance with some other embodiments. FIGS. 23-24 are cross-sectional views shown along reference cross-section A-A' in FIG. 1A and FIG. 21B. A portion of the memory array 50 is illustrated. This embodiment is similar to the embodiment of FIGS. 2-22C, except the conductive spacers 136 are formed by a multiple-patterning process. The multiple-patterning process may be a double-patterning process, a quadruple-patterning process, or the like. Forming the memory array 50 with a multiple-patterning process allows each patterning process to be performed with a low pattern density, which can help reduce defects in the memory array 50.

FIG. 23 is a cross-sectional view of a memory array 50 at a similar stage of manufacturing as FIG. 16 (e.g., after forming the conductive spacers 136). In this embodiment, the conductive spacers 136 are formed by a double-patterning process. The double-patterning process includes separately forming a first subset of the conductive spacers 136A and forming a second subset of the conductive spacers 136B. In some embodiments, the conductive spacers 136A are formed of a different work function material than the conductive spacers 136B such that the material of the conductive spacers 136A has a different resistivity and/or a different work function than the material of the conductive spacers 136B. As such, memory cells having transistors with different threshold voltages may be formed in a same memory array 50. Forming memory cells with transistors having different threshold voltages allows the memory cells to be more easily distinguished between when accessing memory cells which share a common bit line 152B or a common source line 152S. In another embodiment, the conductive spacers 136A, 136B are formed of a same work function material.

As an example to form the conductive spacers 136A, 136B, a first subset of the trenches 122A may be patterned in the staircase structure 114 (see FIG. 11). The trenches 122A may be patterned in the manner described with respect to FIG. 11. The portions of the sacrificial layers 108 exposed by the trenches 122A may then be replaced with word lines 126. The sacrificial layers 108 may be replaced with the word lines 126 in the manner described with respect to FIGS. 12-13. Sidewall recesses 132 may then be formed in the trenches 122A. The sidewall recesses 132 may be formed in the manner described with respect to FIG. 14. The conductive spacers 136A may then be formed in the sidewall recesses 132 of the trenches 122A. The conductive spacers 136A may be formed in the manner described with respect to FIGS. 14-16. Following or prior to the forming of the conductive spacers 136A, a second subset of the trenches 122B may be patterned in the staircase structure 114 (see FIG. 11). The trenches 122B may be patterned in the manner described with respect to FIG. 11. The portions of the sacrificial layers 108 exposed by the trenches 122B may then be replaced with word lines 126. The sacrificial layers 108 may be replaced with the word lines 126 in the manner described with respect to FIGS. 12-13. Sidewall recesses 132 may then be formed in the trenches 122B. The sidewall recesses 132 may be formed in the manner described with respect to FIG. 14. The conductive spacers 136B may then be formed in the sidewall recesses 132 of the trenches 122B. The conductive spacers 136B may be formed in the manner described with respect to FIGS. 14-16. In this embodiment, the trenches 122A and the sidewall recesses 132 in the trenches 122A are formed in a first patterning process, the trenches 122B and the sidewall recesses 132 in the trenches 122B are formed in a second patterning process, and the second patterning process is different from the first patterning process. For example, the second patterning process may be performed after the first patterning process.

FIG. 24 is a cross-sectional view of a memory array at a similar stage of manufacturing as FIG. 22A (e.g., after forming the interconnect layer(s) 160). Appropriate processing steps, such as those described for FIGS. 16-22C may be performed on the structure of FIG. 23 to obtain the structure of FIG. 24. In embodiments where the conductive spacers 136A are formed of a different work function material than the conductive spacers 136B, each bit line 152B and source line 152S contacts conductive spacers 136A, 136B formed of a same work function material. Thus, each of the transistors selected with a bit line 152B and a source line 152S has a same work function. In contrast, each word line 126 contacts conductive spacers 136A, 136B formed of different work function materials. For example, a conductive spacer 136A may contact a first sidewall of a word line 126, and a conductive spacer 136B may contact an opposing second sidewall of that word line 126. Thus, a word line 126 may be used to select transistors of a desired work function by varying the voltage applied through the word line 126.

Embodiments may achieve advantages. Including the conductive spacers 136 allows the work functions of the transistors to be tuned by selecting the work function material of the conductive spacers 136, instead of by selecting the material of the word lines 126. The word lines 126 may thus be formed of a material with a low resistivity such as tungsten, while still allowing for tuning of the work functions of the transistors. Reducing the resistance of the word lines 126 helps increase the performance of the memory array 50. Further, the conductive spacers 136 act as adhesion layers to improve adhesion between the word lines 126 and the memory films 142. The quantity of interface traps between the gate dielectrics and the gate electrodes of the transistors 54 (see FIGS. 1A-1B) may thus be reduced. Decreasing the quantity of interface traps may increase the endurance of the memory films 142, allowing them to sustain more read/write cycles and increasing the lifespan of the memory array 50.

In an embodiment, a device includes: a first word line over a substrate, the first word line including a first conductive material; a first bit line intersecting the first word line; a first memory film between the first bit line and the first word line; and a first conductive spacer between the first memory film and the first word line, the first conductive spacer including a second conductive material, the second conductive material having a different work function than the first conductive material, the first conductive material having a lower resistivity than the second conductive material. In some embodiments, the device further includes: a second bit line intersecting the first word line; a second memory film between the second bit line and the first word line; and a second conductive spacer between the second memory film and the first word line, the second conductive spacer including the second conductive material. In some embodiments, the device further includes: a second bit line intersecting the first word line; a second memory film between the second bit line and the first word line; and a second conductive spacer between the second memory film and the first word line, the second conductive spacer including a third conductive material, the third conductive material having a different work function than the second conductive material and the first conductive material, the first conductive material having a lower resistivity than the third conductive material. In some embodiments, the device further includes: a second word line over the first word line, the first bit line intersecting the second word line; a second memory film between the first bit line and the second word line; and a second conductive spacer between the second memory film and the second word line, the second conductive spacer including the second conductive material. In some embodiments of the device, the first conductive spacer is disposed on a sidewall of the first word line, and the device further includes: dielectric layers over the substrate, the first word line and the first conductive spacer disposed between a pair of the dielectric layers, the sidewall of the first word line being recessed from sidewalls of the dielectric layers, an outer sidewall of the first conductive spacer being flush with the sidewalls of the dielectric layers. In some embodiments of the device, the first word line includes a main layer between liner layers, the first conductive spacer disposed on a sidewall of the main layer and on sidewalls of the liner layers, and the device further includes: dielectric layers over the substrate, the first word line and the first conductive spacer disposed between a pair of the dielectric layers, the sidewall of the main layer being recessed from sidewalls of the dielectric layers by a first distance, the sidewalls of the liner layers being recessed from the sidewalls of the dielectric layers by a second distance, the second distance less than the first distance. In some embodiments of the device, the first conductive material is tungsten, and the second conductive material is cobalt, ruthenium, tungsten, tungsten nitride, tungsten carbonitride, molybdenum, molybdenum nitride, or titanium nitride. In some embodiments of the device, the first memory film has a greater thickness than the first conductive spacer.

In an embodiment, a device includes: a memory cell over a substrate, the memory cell including a thin film transistor, the thin film transistor including: a gate electrode including a portion of a first conductive line and a work function tuning layer, the work function tuning layer disposed on a sidewall of the first conductive line, the first conductive line extending in a first direction; a gate dielectric including a portion of a memory film, the memory film disposed on a sidewall of the work function tuning layer; a channel region including a portion of a semiconductor film, the semiconductor film disposed on a sidewall of the memory film; and a source/drain electrode including a portion of a second conductive line, the second conductive line disposed on a sidewall of the semiconductor film, the second conductive line extending in a second direction, the second direction perpendicular to the first direction. In some embodiments of the device, the first conductive line and the second conductive line include a first conductive material, the work function tuning layer includes a second conductive material, and the first conductive material has a lower resistivity than the second conductive material. In some embodiments of the device, the first conductive line and the second conductive line include a first conductive material, the work function tuning layer includes a second conductive material, and the first conductive material has a different work function than the second conductive material. In some embodiments, the device further includes: interconnects over the memory cell, the interconnects connected to the first conductive line and to the second conductive line.

In an embodiment, a method includes: forming a word line between a pair of dielectric layers, the word line formed of a first conductive material; recessing a first sidewall of the word line from first sidewalls of the dielectric layers to form a first sidewall recess between the dielectric layers; forming a first conductive spacer in the first sidewall recess and on the first sidewall of the word line, the first conductive spacer formed of a second conductive material, the second conductive material different from the first conductive material; forming a memory film on a sidewall of the first conductive spacer and the first sidewalls of the dielectric layers; forming a semiconductor film on a sidewall of the memory film; and forming a bit line on a sidewall of the semiconductor film. In some embodiments, the method further includes: recessing a second sidewall of the word line from second sidewalls of the dielectric layers to form a second sidewall recess between the dielectric layers, the second sidewall of the word line opposite the first sidewall of the word line; and forming a second conductive spacer in the second sidewall recess and on the second sidewall of the word line, the second conductive spacer formed of a third conductive material, the third conductive material different from the second conductive material and the first conductive material. In some embodiments of the method, the first sidewall of the word line is recessed in a first patterning process, the second sidewall of the word line is recessed in a second patterning process, and the second patterning process is performed after the first patterning process. In some embodiments, the method further includes: recessing a second sidewall of the word line from second sidewalls of the dielectric layers to form a second sidewall recess between the dielectric layers, the second sidewall of the word line opposite the first sidewall of the word line; and forming a second conductive spacer in the second sidewall recess and on the second sidewall of the word line, the second conductive spacer formed of the second conductive material. In some embodiments of the method, the first sidewall of the word line and the second sidewall of the word line are recessed in a same patterning process. In some embodiments of the method, forming the word line includes: etching a trench in a staircase structure, the staircase structure including the dielectric layers and a sacrificial layer between the dielectric layers; removing a portion of the sacrificial layer to form a sidewall opening between the dielectric layers; depositing the first conductive material in the sidewall opening and the trench; and removing portions of the first conductive material in the trench, a portion of the first conductive material remaining in the sidewall opening forming the word line. In some embodiments of the method, forming the first conductive spacer includes: depositing the second conductive material in the first sidewall recess and the trench; and removing portions of the second conductive material in the trench, a portion of the second conductive material remaining in the first sidewall recess forming the first conductive spacer. In some embodiments of the method, the second conductive material is deposited at a temperature of less than or equal to 500° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a word line between a pair of dielectric layers, the word line formed of a first metal;
   recessing a first sidewall of the word line from first sidewalls of the dielectric layers to form a first sidewall recess between the dielectric layers;
   forming a first conductive spacer in the first sidewall recess and on the first sidewall of the word line, the first conductive spacer physically contacting the first side- wall of the word line, the first conductive spacer formed of a second metal, the second metal different from the first metal;

forming a memory film on a sidewall of the first conductive spacer and the first sidewalls of the dielectric layers;

forming a semiconductor film on a sidewall of the memory film; and forming a bit line on a sidewall of the semiconductor film.

2. The method of claim 1, further comprising:

recessing a second sidewall of the word line from second sidewalls of the dielectric layers to form a second sidewall recess between the dielectric layers, the second sidewall of the word line opposite the first sidewall of the word line; and forming a second conductive spacer in the second sidewall recess and on the second sidewall of the word line, the second conductive spacer formed of a third metal, the third metal different from the second metal and the first metal.

3. The method of claim 2, wherein the first sidewall of the word line is recessed in a first patterning process, the second sidewall of the word line is recessed in a second patterning process, and the second patterning process is performed after the first patterning process.

4. The method of claim 1, further comprising:

recessing a second sidewall of the word line from second sidewalls of the dielectric layers to form a second sidewall recess between the dielectric layers, the second sidewall of the word line opposite the first sidewall of the word line; and forming a second conductive spacer in the second sidewall recess and on the second sidewall of the word line, the second conductive spacer formed of the second conductive-material metal.

5. The method of claim 4, wherein the first sidewall of the word line and the second sidewall of the word line are recessed in a same patterning process.

6. The method of claim 1, wherein forming the word line comprises:

etching a trench in a staircase structure, the staircase structure comprising the dielectric layers and a sacrificial layer between the dielectric layers;

removing a portion of the sacrificial layer to form a sidewall opening between the dielectric layers;

depositing the first metal in the sidewall opening and the trench; and removing portions of the first metal in the trench, a portion of the first metal remaining in the sidewall opening forming the word line.

7. The method of claim 6, wherein forming the first conductive spacer comprises:

depositing the second metal in the first sidewall recess and the trench; and removing portions of the second metal in the trench, a portion of the second metal remaining in the first sidewall recess forming the first conductive spacer.

8. The method of claim 7, wherein the second metal is deposited at a temperature of less than or equal to 500° C.

9. The method of claim 1, wherein the first metal has a different work function than the second metal.

10. The method of claim 1, wherein the first metal has a different resistivity than the second metal.

11. The method of claim 1, wherein the memory film is formed to a greater thickness than the first conductive spacer.

12. The method of claim 1, further comprising:

forming interconnects that are connected to the word line and to the bit line.

13. The method of claim 1, further comprising:

after forming the first conductive spacer, recessing a second sidewall of the word line from second sidewalls of the dielectric layers to form a second sidewall recess between the dielectric layers, the second sidewall of the word line opposite the first sidewall of the word line; and forming a second conductive spacer in the second sidewall recess and on the second sidewall of the word line.

14. A method comprising:

recessing a first sidewall of a word line to form a first sidewall recess, the word line formed of a first conductive material, the word line extending in a first direction;

forming a first conductive spacer in the first sidewall recess and on the first sidewall of the word line, the first conductive spacer formed of a second conductive material, the second conductive material having a different work function than the first conductive material, the first conductive material having a lower resistivity than the second conductive material;

recessing a second sidewall of the word line to form a second sidewall recess, the second sidewall of the word line opposite the first sidewall of the word line;

forming a second conductive spacer in the second sidewall recess and on the second sidewall of the word line, the second conductive spacer formed of a third conductive material, the third conductive material having a different work function than the second conductive material and the first conductive material, the first conductive material having a lower resistivity than the third conductive material;

forming a memory film on a sidewall of the first conductive spacer;

forming a semiconductor film on a sidewall of the memory film; and forming a bit line on a sidewall of the semiconductor film, the bit line extending in a second direction, the second direction perpendicular to the first direction.

15. The method of claim 14, wherein the memory film is formed to a greater thickness than the first conductive spacer.

16. The method of claim 14, wherein the first conductive spacer contacts the first sidewall of the word line and the second conductive spacer contacts the second sidewall of the word line.

17. A method comprising:

forming a word line between a pair of dielectric layers, the word line formed of a first conductive material;

forming a first conductive spacer on a first sidewall of the word line, a first sidewall of the first conductive spacer being flush with first sidewalls of the dielectric layers, the first conductive spacer formed of a second conductive material, the second conductive material different from the first conductive material;

after forming the first conductive spacer, forming a second conductive spacer on a second sidewall of the word line, a second sidewall of the second conductive spacer being flush with second sidewalls of the dielectric layers, the second conductive spacer formed of a third conductive material, the third conductive material different from the second conductive material and the first conductive material;

depositing a memory layer on the first sidewall of the first conductive spacer and on the second sidewall of the second conductive spacer; and depositing a semiconductor layer on the memory layer.

18. The method of claim 17, further comprising:

forming an isolation material on the semiconductor layer; and forming a conductive line through the isolation material.

19. The method of claim 18, further comprising:

dividing the conductive line into a bit line and a source line; and forming interconnects that are connected to the bit line, the source line, and the word line.

20. The method of claim 17, wherein the first conductive spacer contacts the first sidewall of the word line and the second conductive spacer contacts the second sidewall of the word line.

* * * * *